(12) United States Patent
Sato et al.

(10) Patent No.: US 10,658,453 B2
(45) Date of Patent: May 19, 2020

(54) ALUMINUM COMPATIBLE THIN-FILM RESISTOR (TFR) AND MANUFACTURING METHODS

(71) Applicant: Microchip Technology Incorporated, Chandler, AZ (US)

(72) Inventors: Justin Hiroki Sato, West Linn, OR (US); Yaojian Leng, Portland, OR (US); Greg Stom, Rhododendron, OR (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 16/037,889

(22) Filed: Jul. 17, 2018

(65) Prior Publication Data

US 2019/0386091 A1 Dec. 19, 2019

Related U.S. Application Data

(60) Provisional application No. 62/685,676, filed on Jun. 15, 2018.

(51) Int. Cl.
*H01L 49/02* (2006.01)
*H01L 23/522* (2006.01)
(Continued)

(52) U.S. Cl.
CPC .......... *H01L 28/24* (2013.01); *H01L 21/2855* (2013.01); *H01L 21/31111* (2013.01);
(Continued)

(58) Field of Classification Search
None
See application file for complete search history.

(56) References Cited

U.S. PATENT DOCUMENTS 9,679,844 B2 6/2017 Leng et al.
2008/0237800 A1* 10/2008 Chinthakindi .... H01L 21/76895
257/537
(Continued)

FOREIGN PATENT DOCUMENTS

CN 104051614 A 9/2014 ............. H01L 45/00

OTHER PUBLICATIONS

International Search Report and Written Opinion, Application No. PCT/US2019/036242, 11 pages, dated Oct. 8, 2019.

*Primary Examiner* — Jay C Chang
(74) *Attorney, Agent, or Firm* — Slayden Grubert Beard PLLC

(57) ABSTRACT

A method for manufacturing a thin film resistor (TFR) module in an integrated circuit (IC) structure may include forming a trench in a dielectric region; forming a TFR element in the trench, the TFR element including a laterally-extending TFR region and a TFR ridge extending upwardly from a laterally-extending TFR region; depositing at least one metal layer over the TFR element; and patterning the at least one metal layer and etching the at least one metal layer using a metal etch to define a pair of metal TFR heads over the TFR element, wherein the metal etch also removes at least a portion of the upwardly-extending TFR ridge. The method may also include forming at least one conductive TFR contact extending through the TFR element and in contact with a respective TFR head to thereby increase a conductive path between the respective TFR head and the TFR element.

20 Claims, 20 Drawing Sheets

(51) Int. Cl.
  *H01L 21/311*  (2006.01)
  *H01L 21/3205*  (2006.01)
  *H01L 21/3213*  (2006.01)
  *H01L 21/768*  (2006.01)
  *H01L 21/285*  (2006.01)
  *H01L 21/3105*  (2006.01)
  *H01L 21/02*  (2006.01)

(52) U.S. Cl.
  CPC .. *H01L 21/32051* (2013.01); *H01L 21/32133* (2013.01); *H01L 21/32139* (2013.01); *H01L 21/76802* (2013.01); *H01L 21/76877* (2013.01); *H01L 23/5228* (2013.01); *H01L 21/0217* (2013.01); *H01L 21/31053* (2013.01)

(56) References Cited

U.S. PATENT DOCUMENTS

| | | | |
|---|---|---|---|
| 2009/0017591 A1* | 1/2009 | Cervin-Lawry | H01G 4/33 438/384 |
| 2009/0065898 A1 | 3/2009 | Chinthakindi et al. | 257/536 |
| 2013/0093024 A1 | 4/2013 | Eshun | 257/379 |
| 2013/0168816 A1 | 7/2013 | Kang et al. | 257/536 |
| 2014/0246730 A1 | 9/2014 | Hung et al. | 257/379 |
| 2015/0162396 A1* | 6/2015 | Yagi | H01L 28/20 257/532 |
| 2017/0221797 A1* | 8/2017 | Tseng | H01L 28/24 |

* cited by examiner

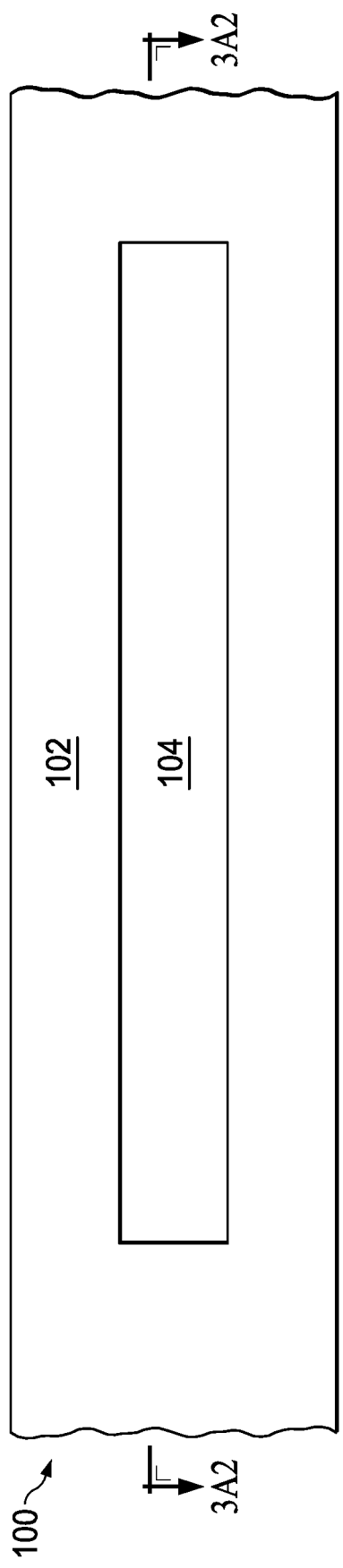
FIG. 3A1
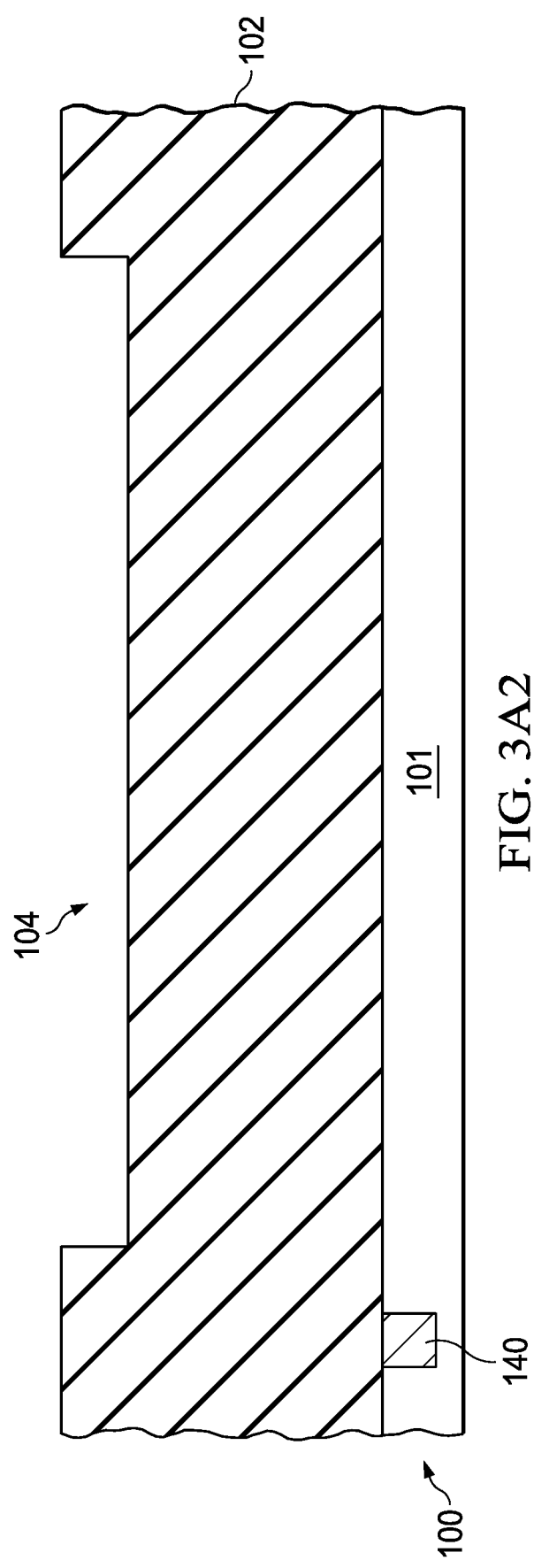
FIG. 3A2

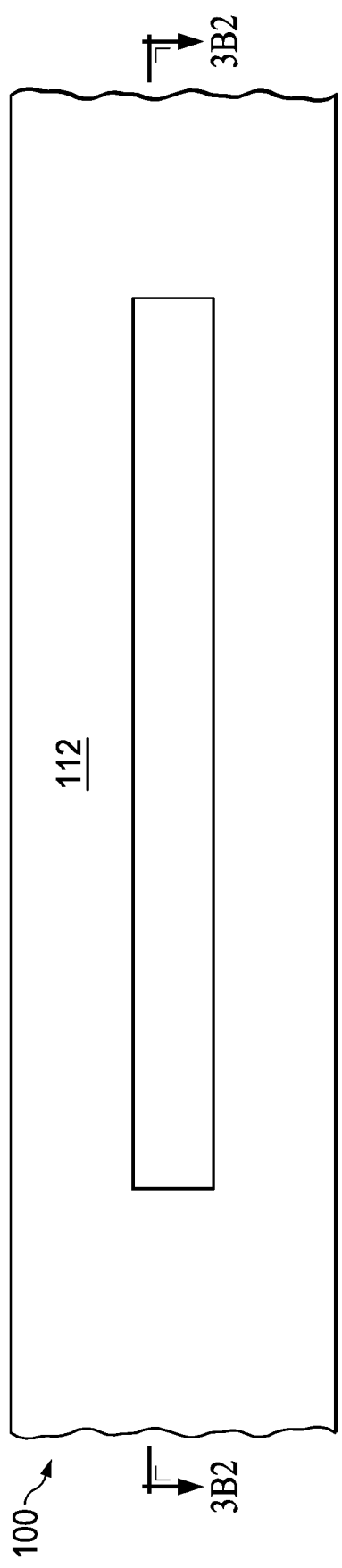
FIG. 3B1
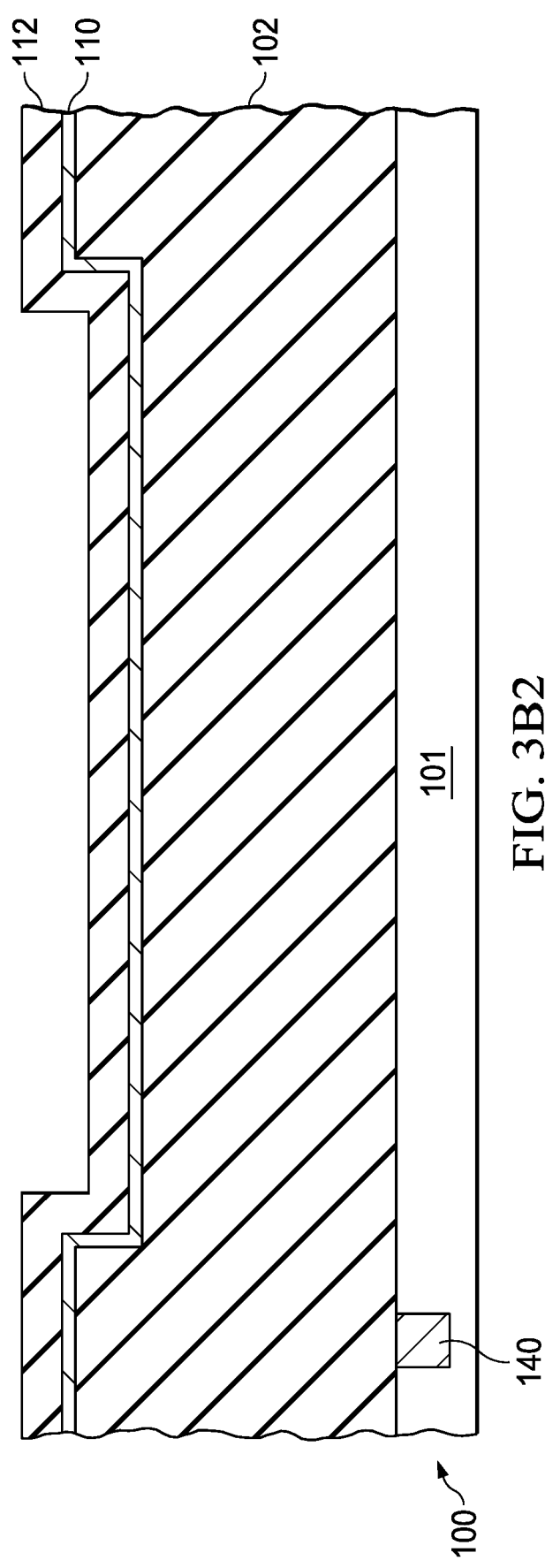
FIG. 3B2

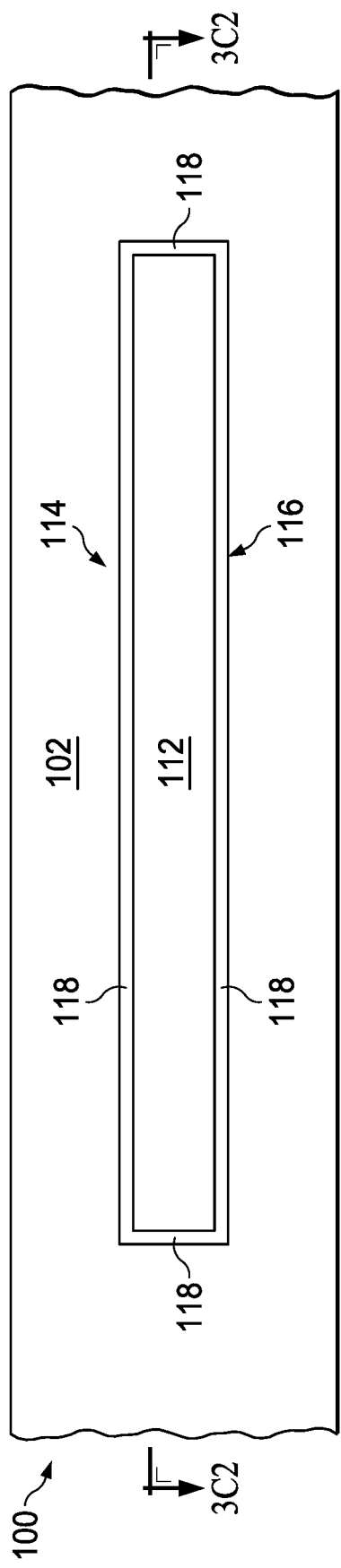
FIG. 3C1
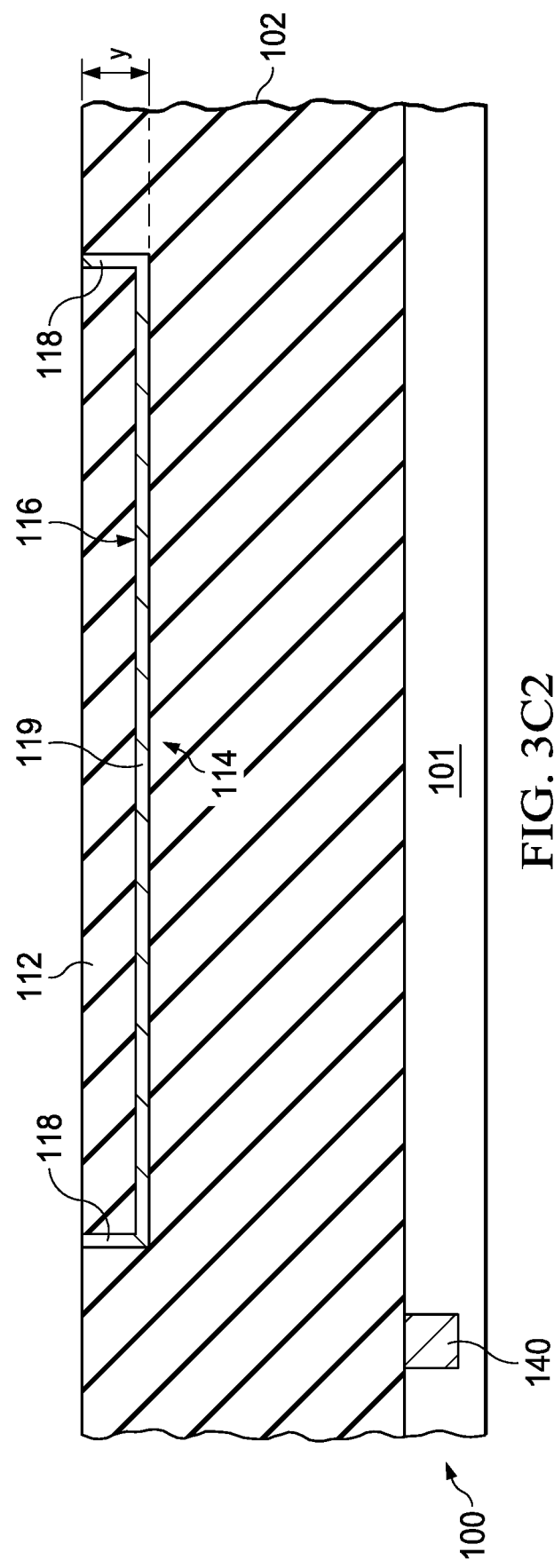
FIG. 3C2

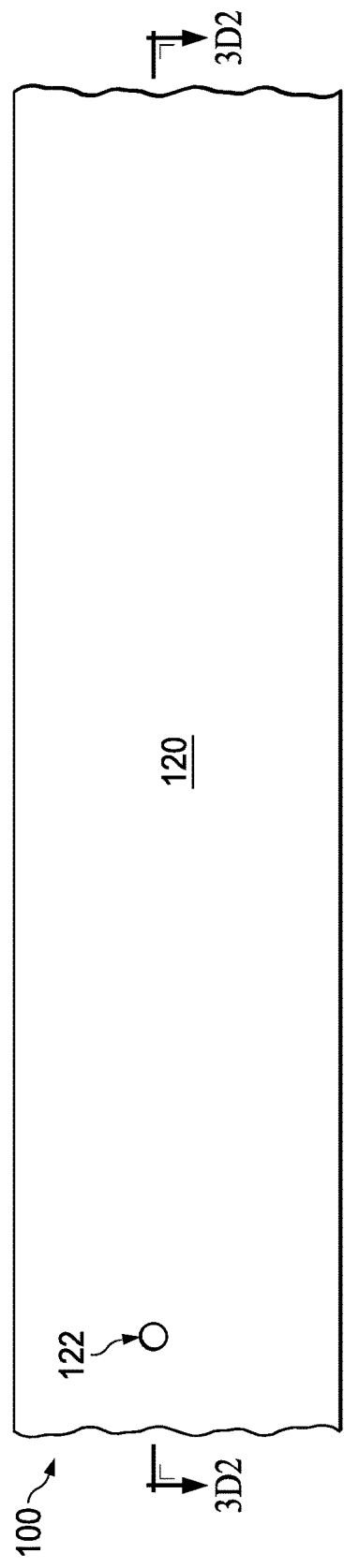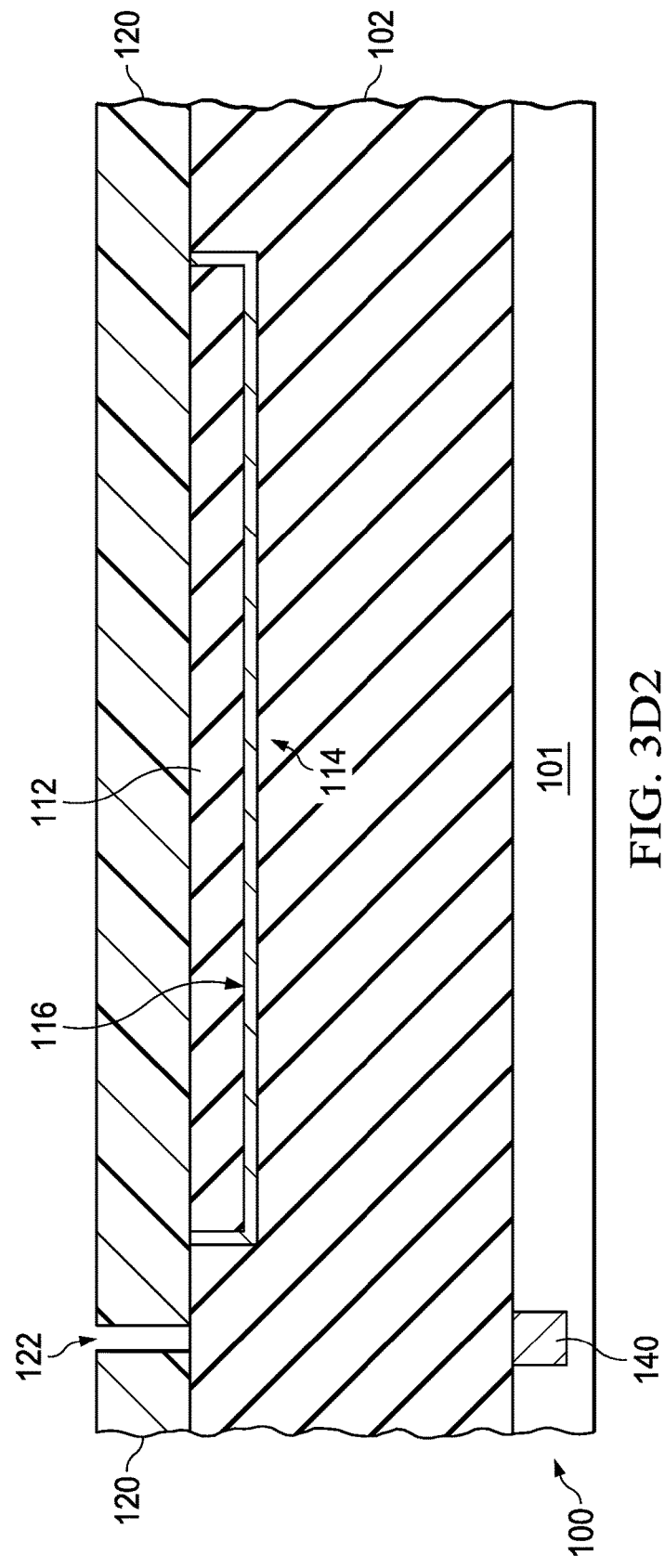

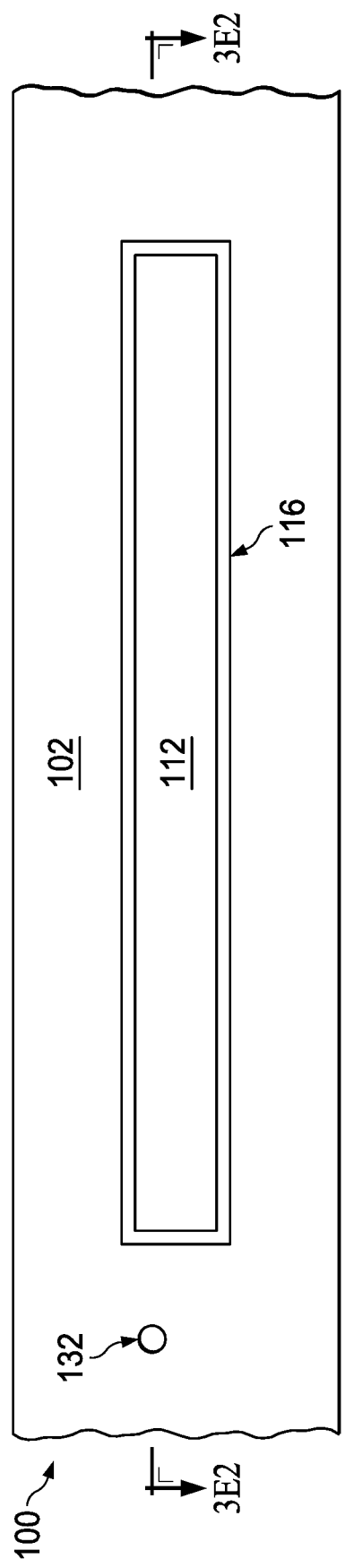
FIG. 3E1
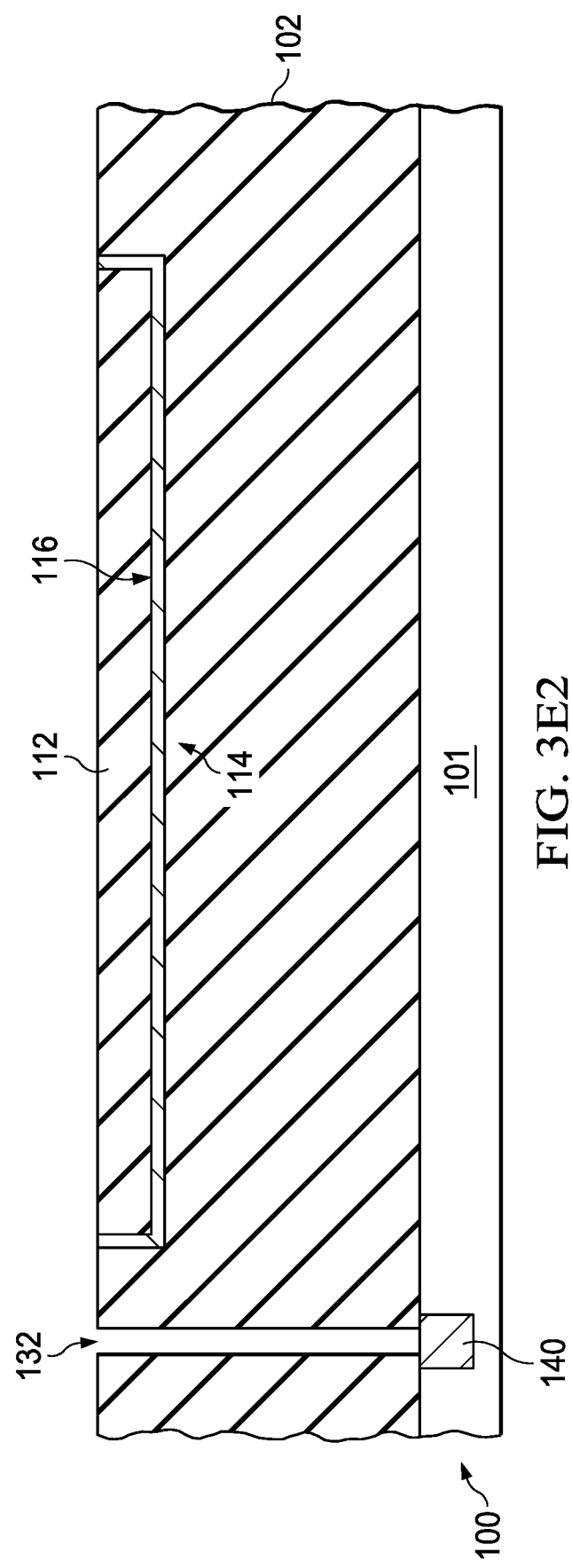
FIG. 3E2

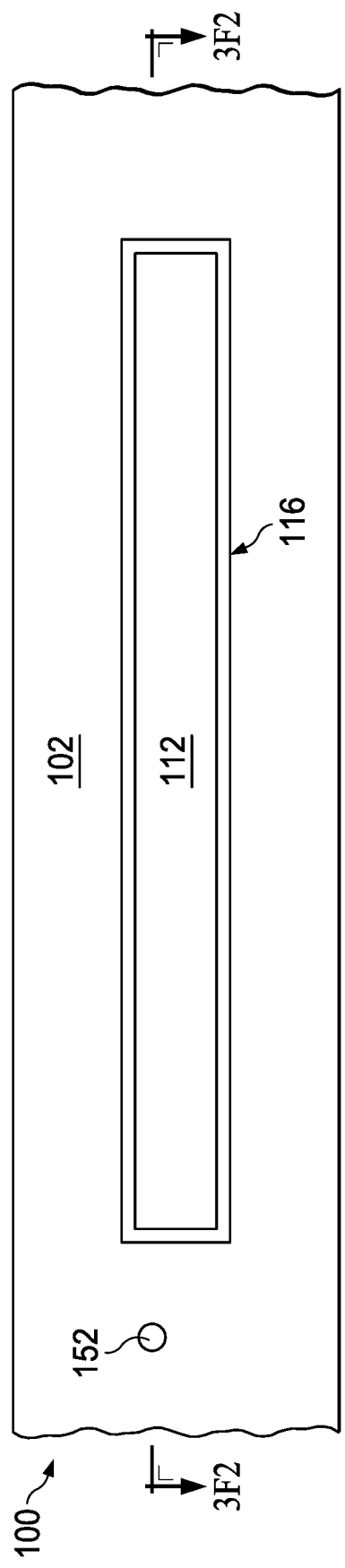
FIG. 3F1
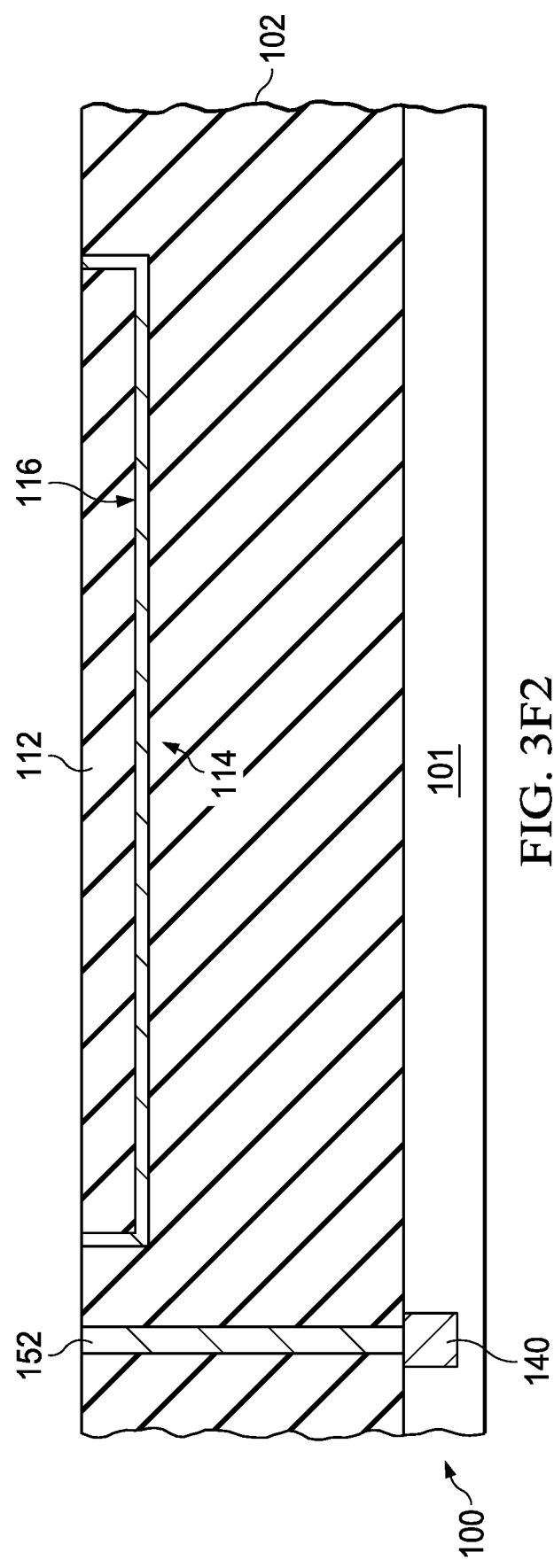
FIG. 3F2

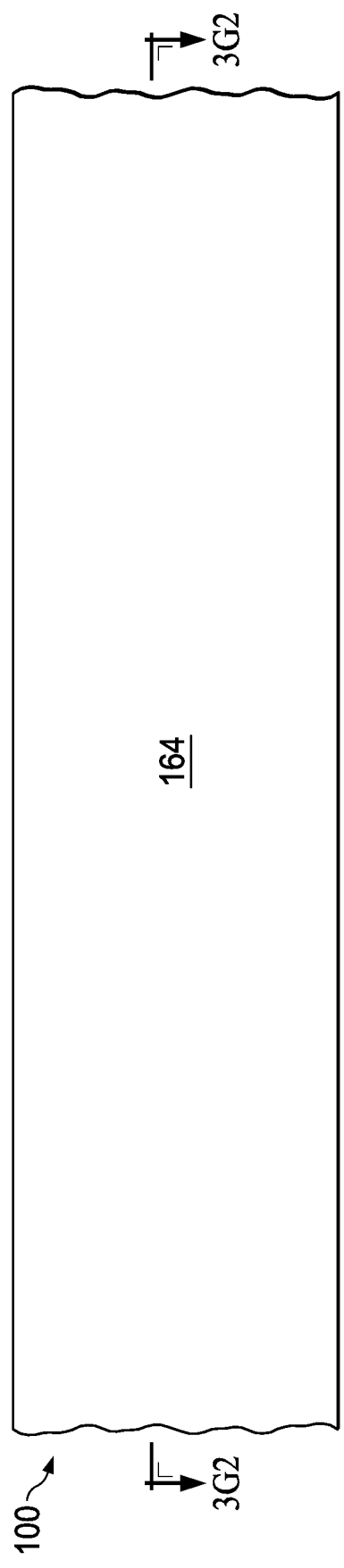
FIG. 3G1
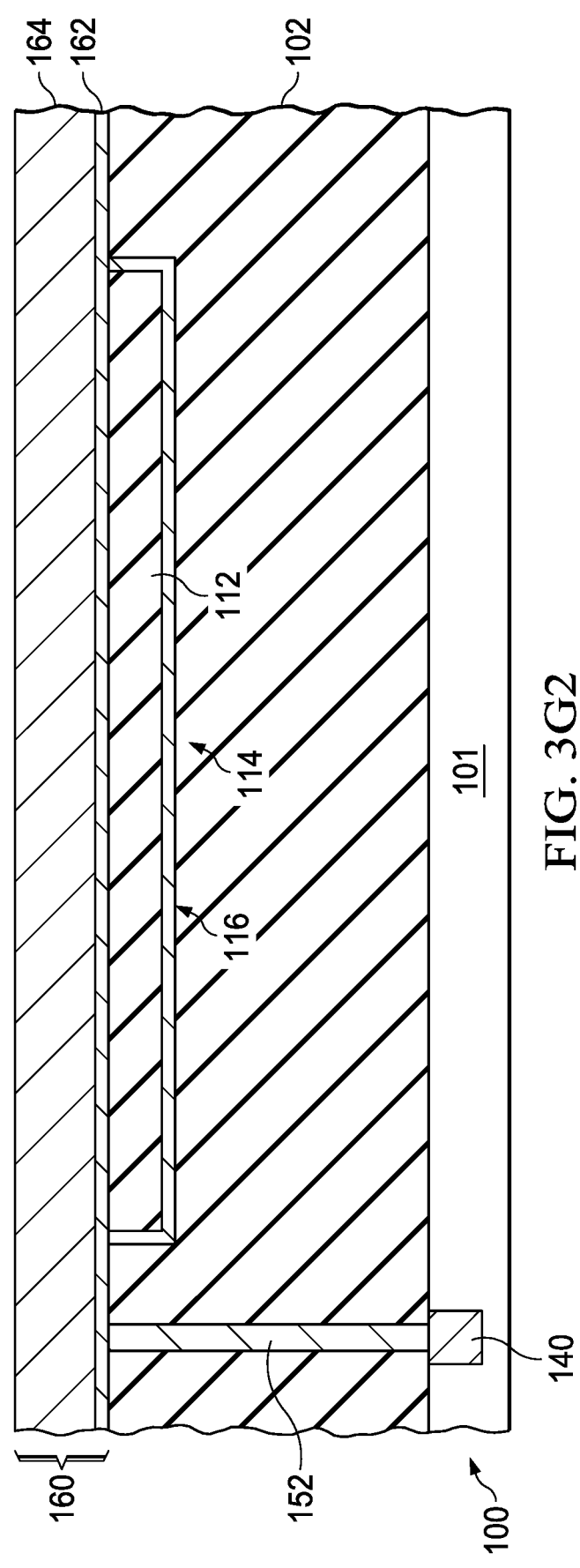
FIG. 3G2

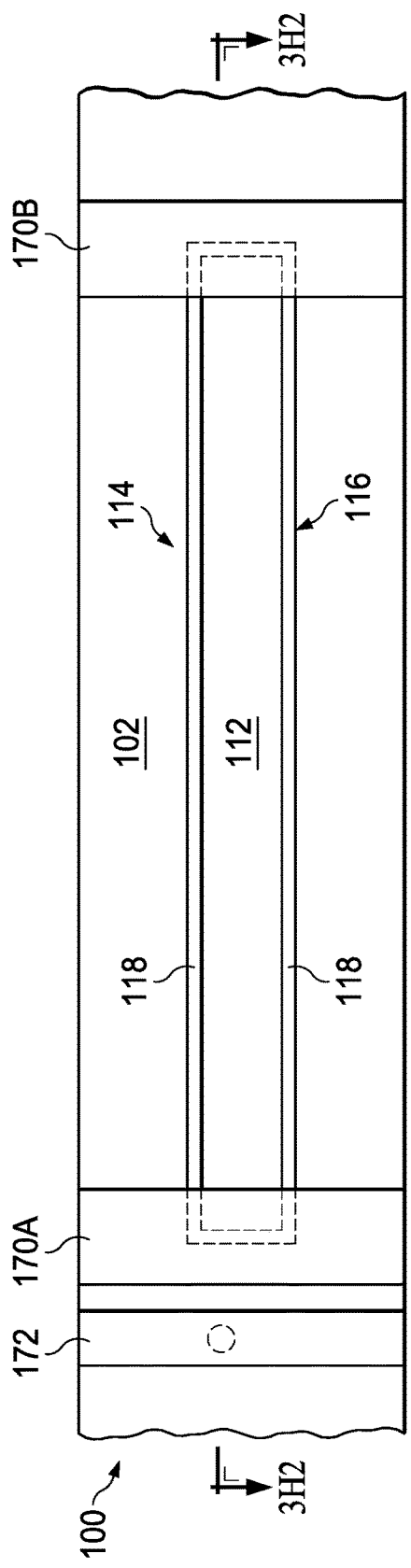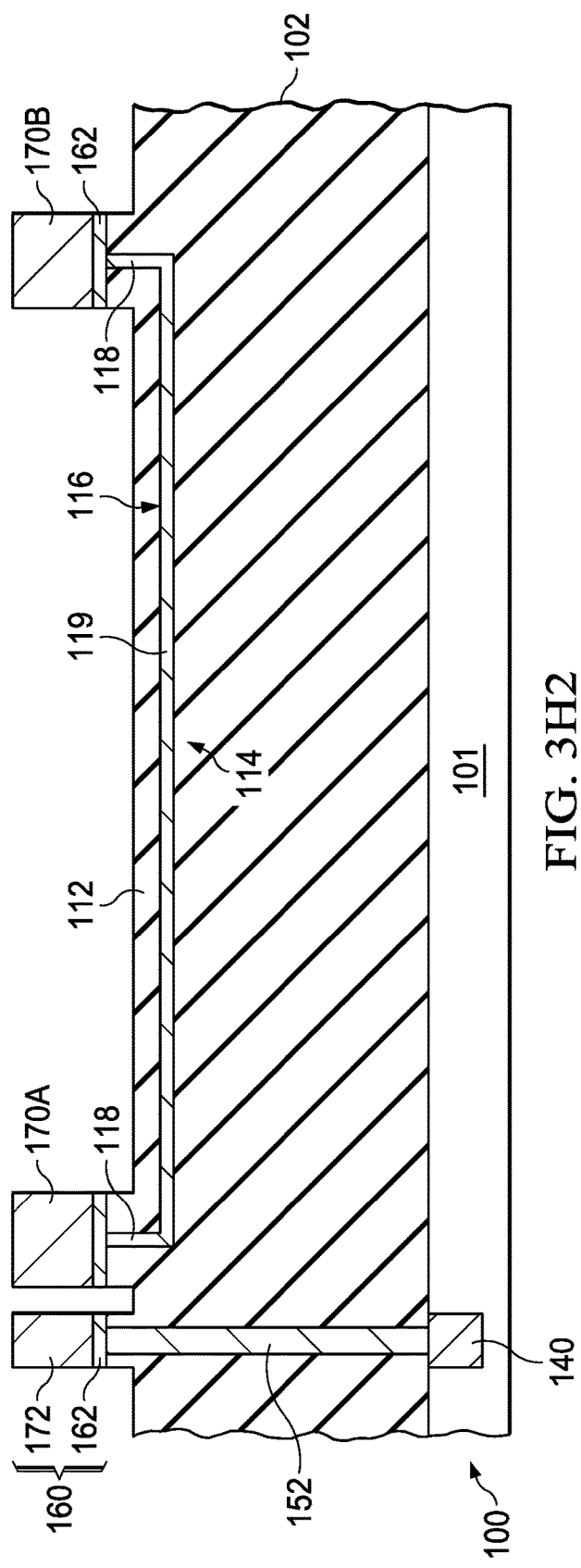
FIG. 3H1
FIG. 3H2

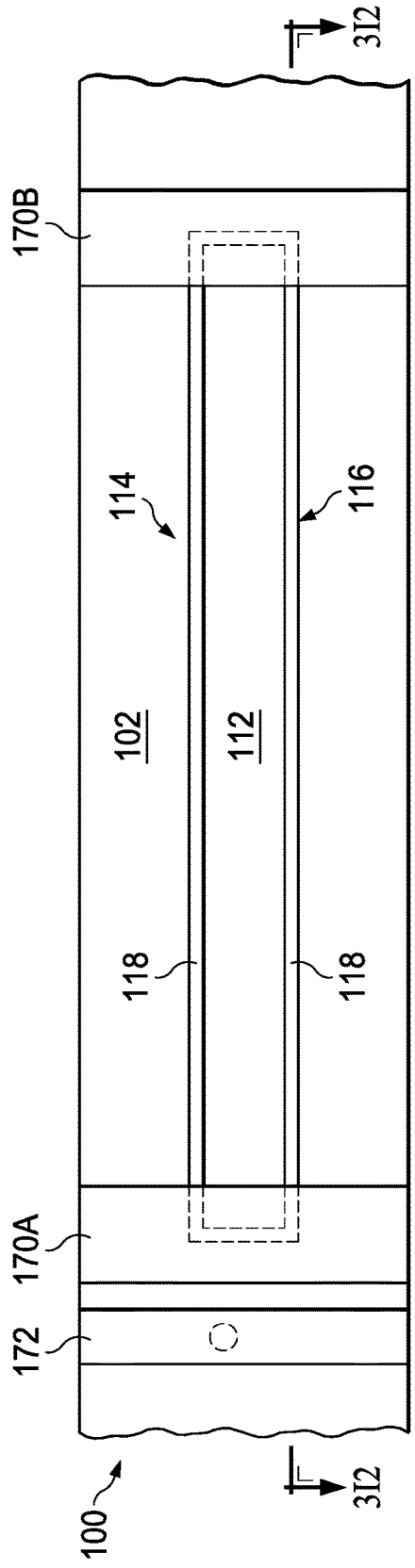
FIG. 3I1
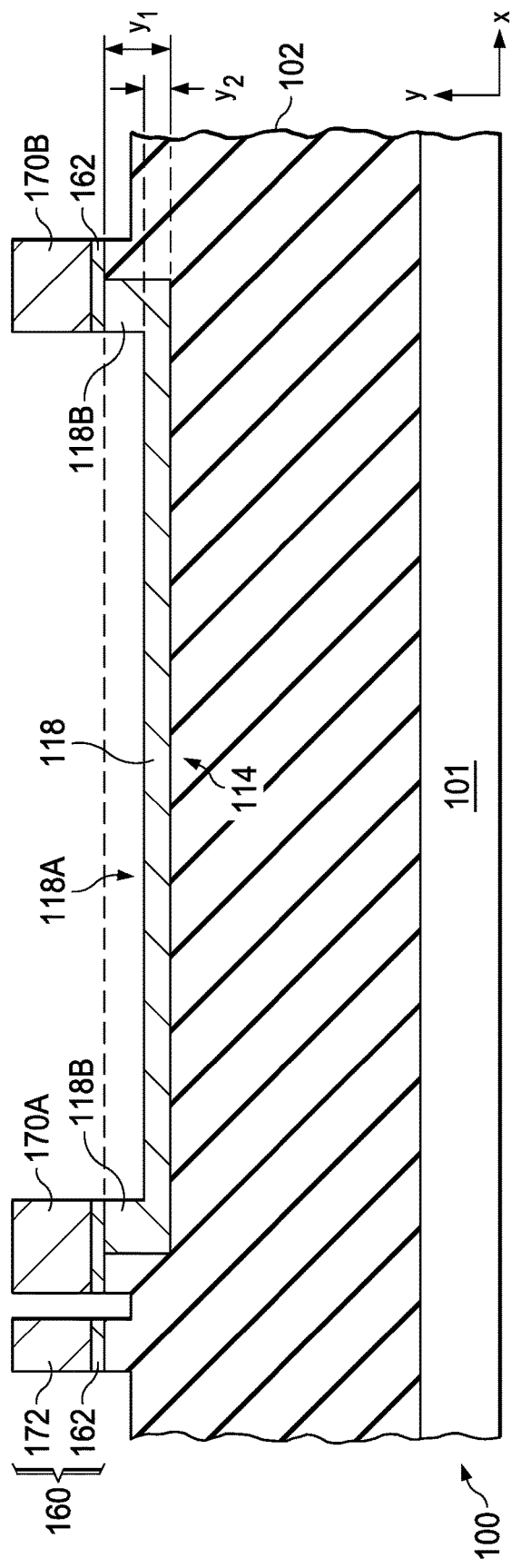
FIG. 3I2

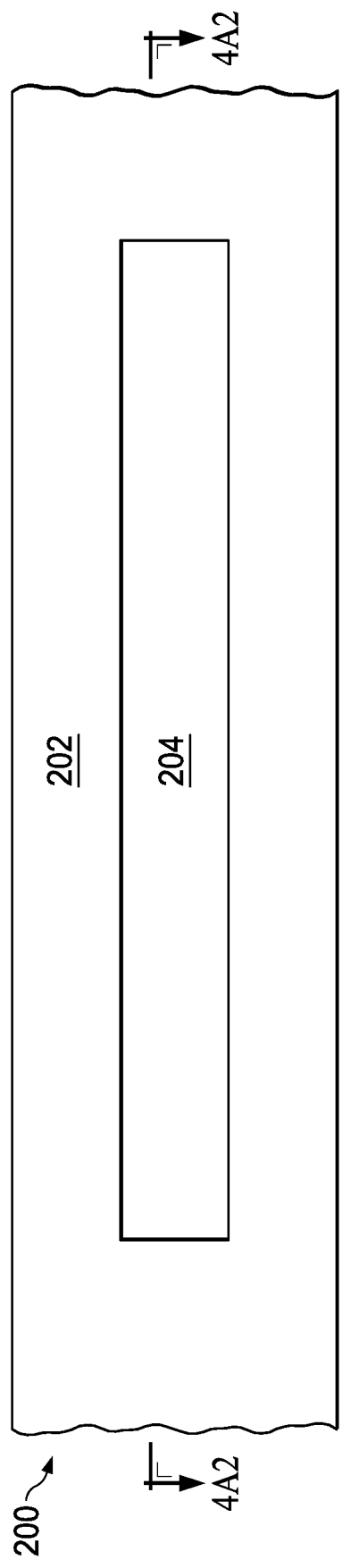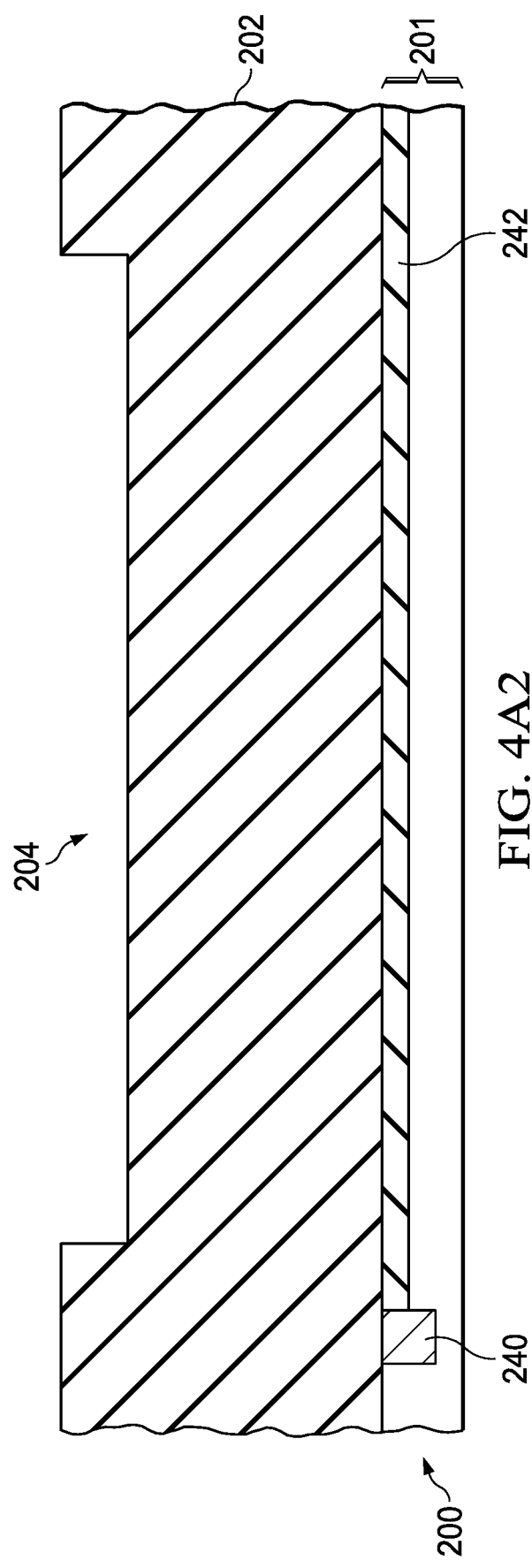
FIG. 4A1
FIG. 4A2

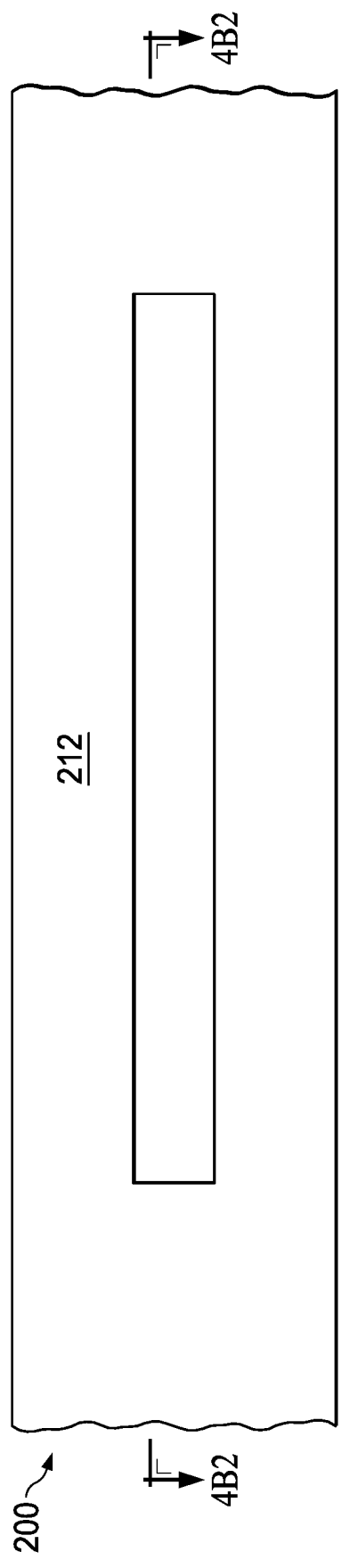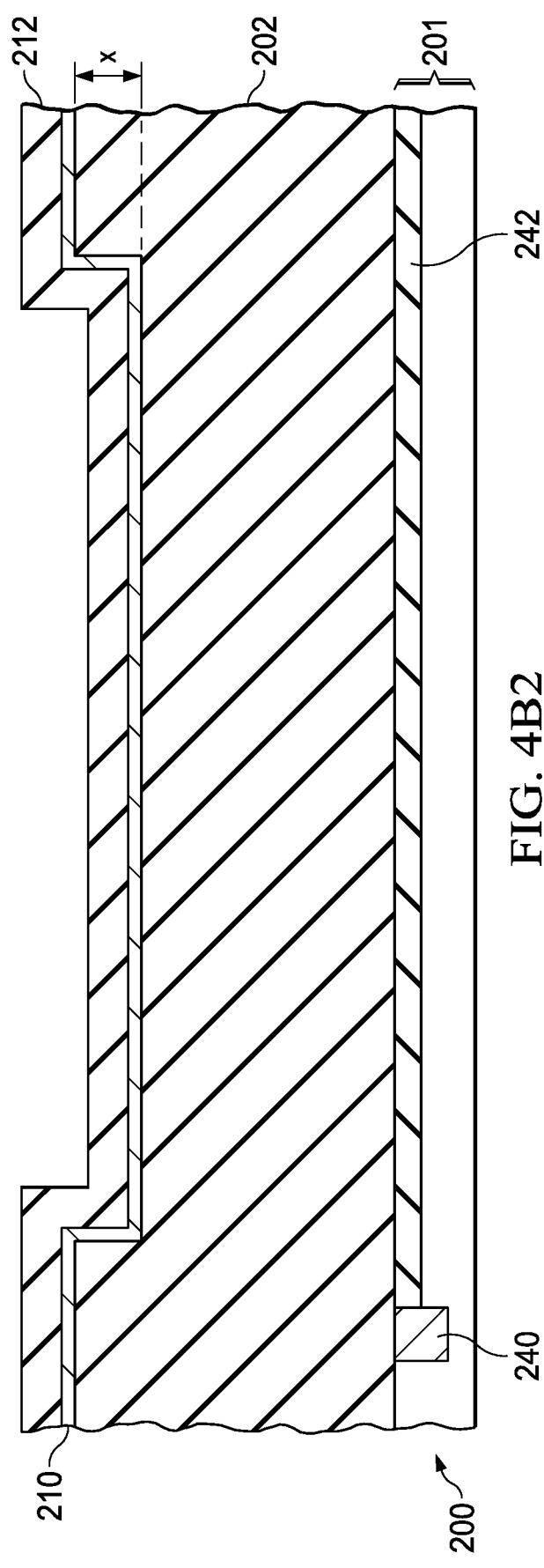
FIG. 4B1
FIG. 4B2

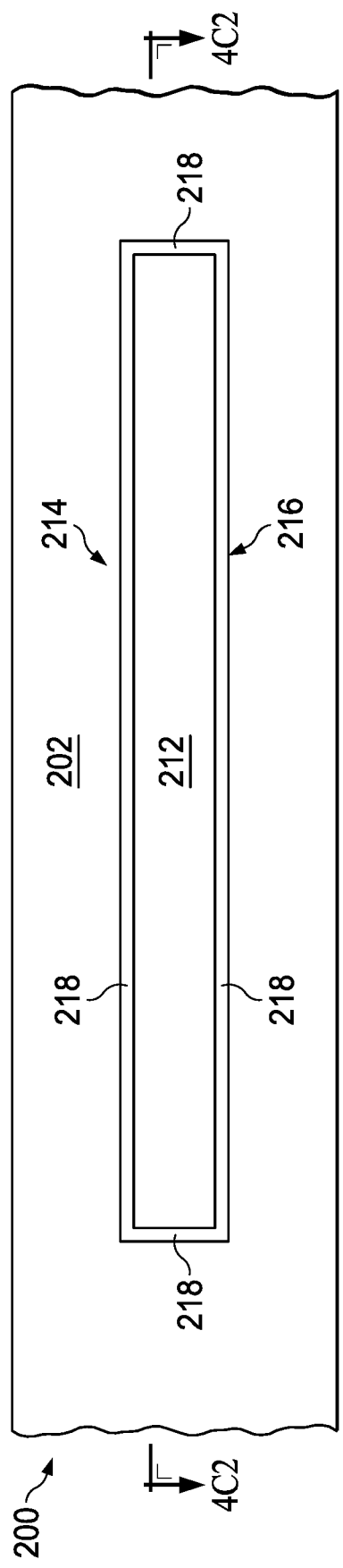
FIG. 4C1
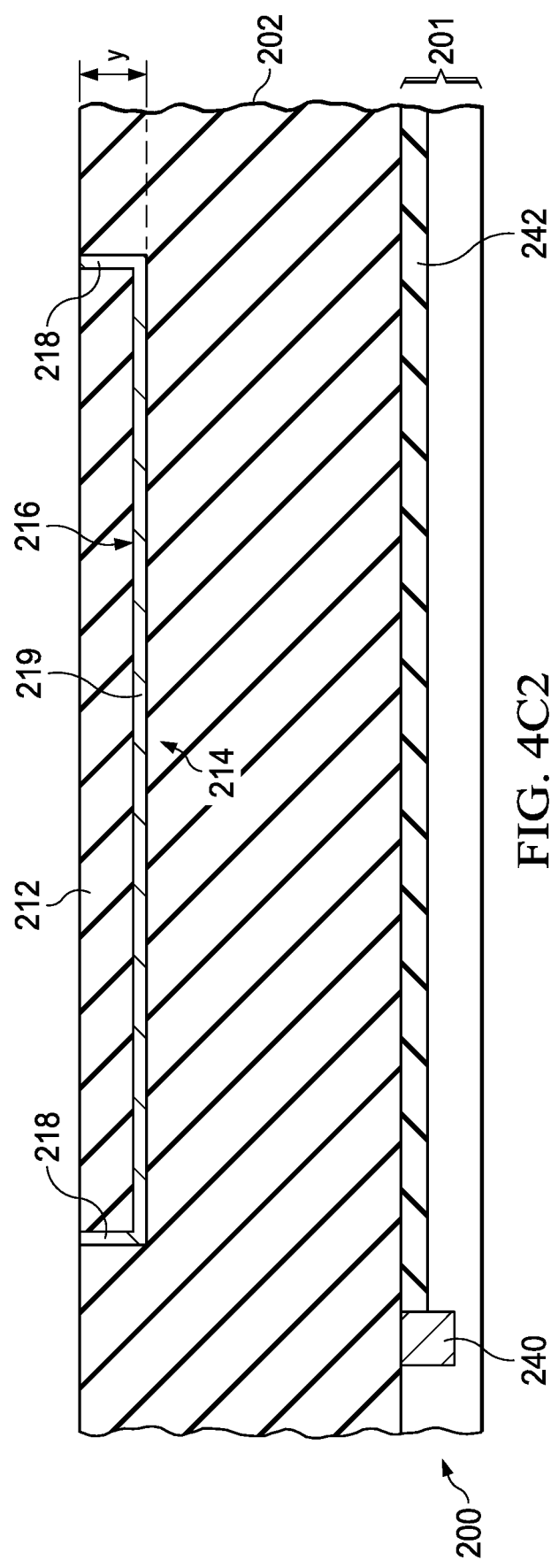
FIG. 4C2

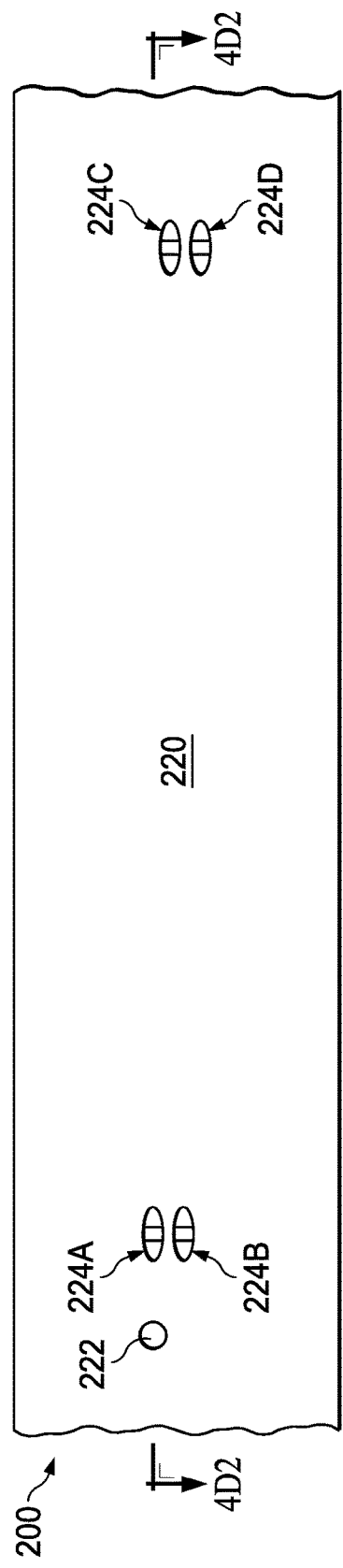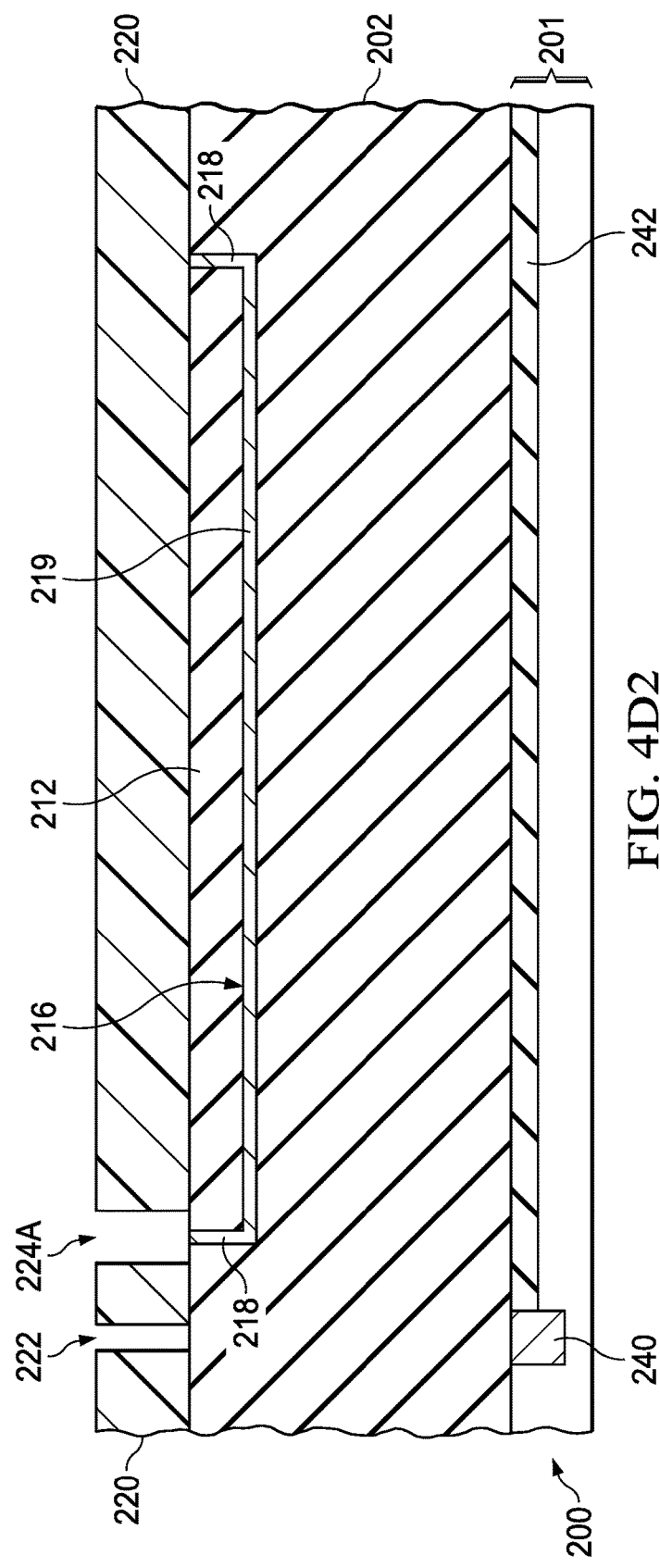
FIG. 4D1
FIG. 4D2

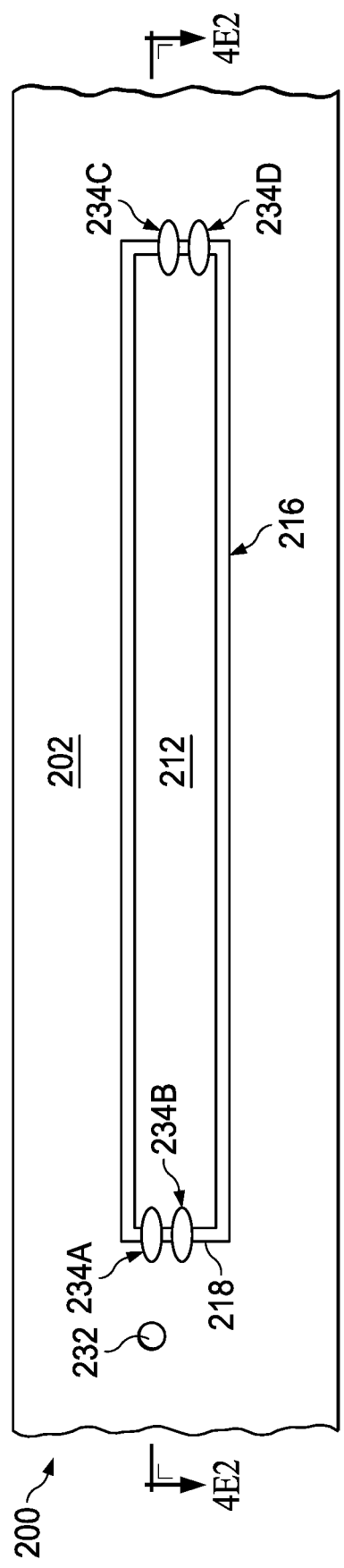
FIG. 4E1
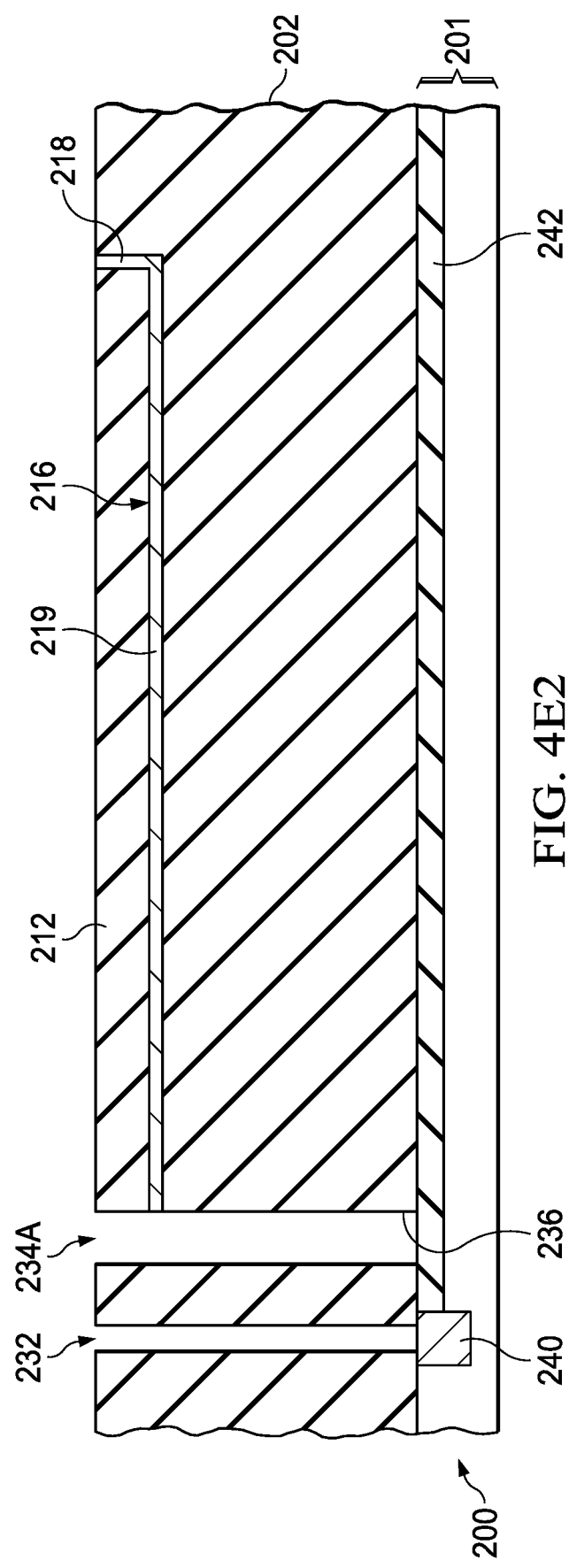
FIG. 4E2

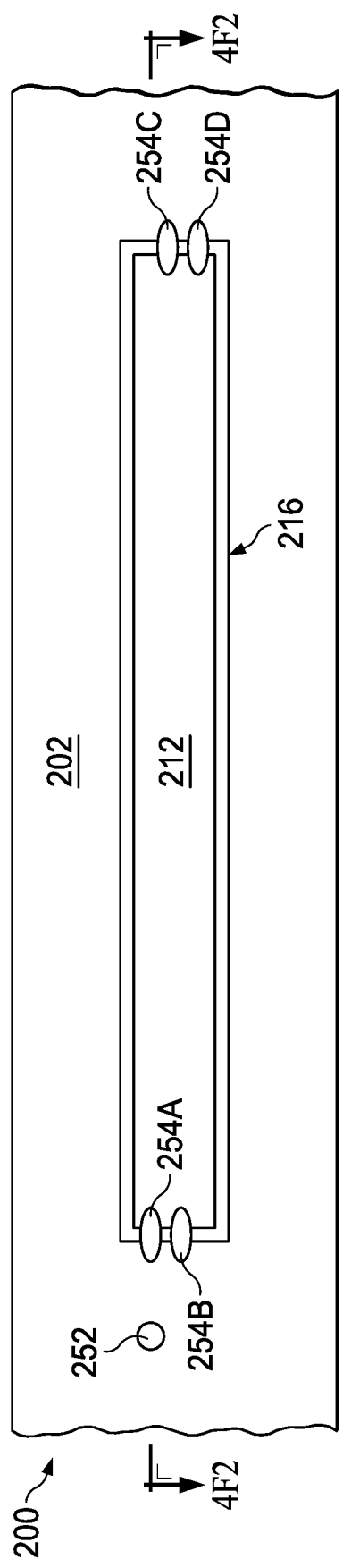
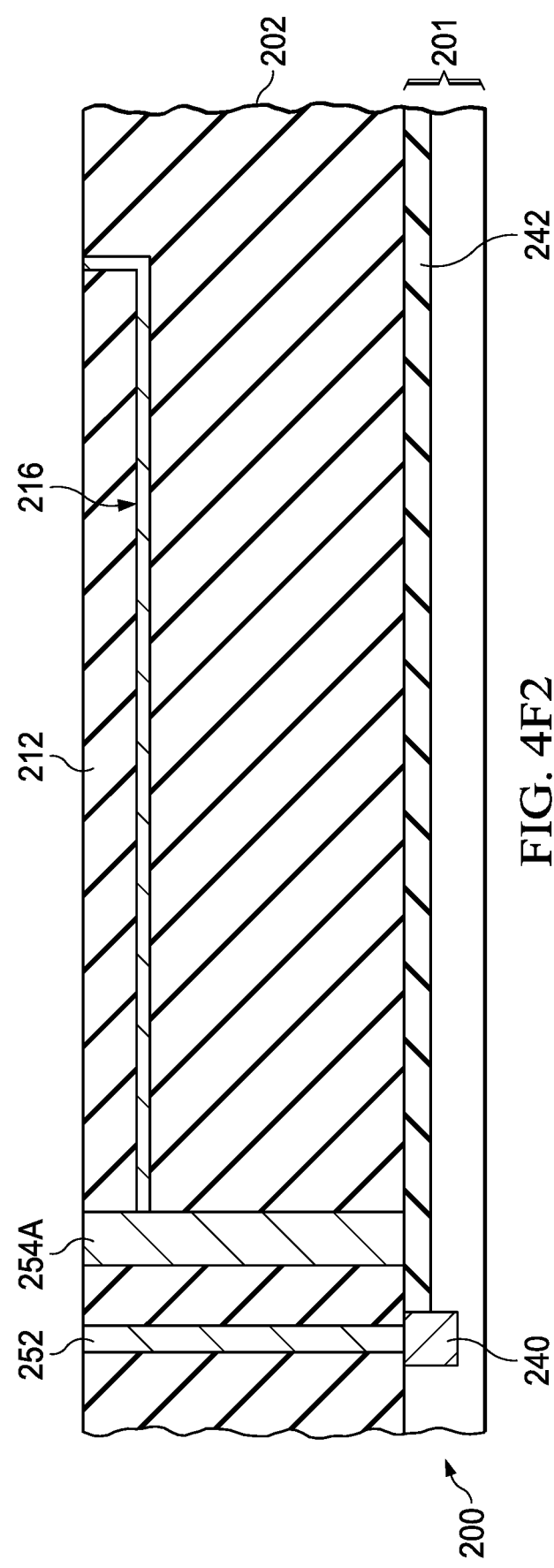
FIG. 4F1
FIG. 4F2

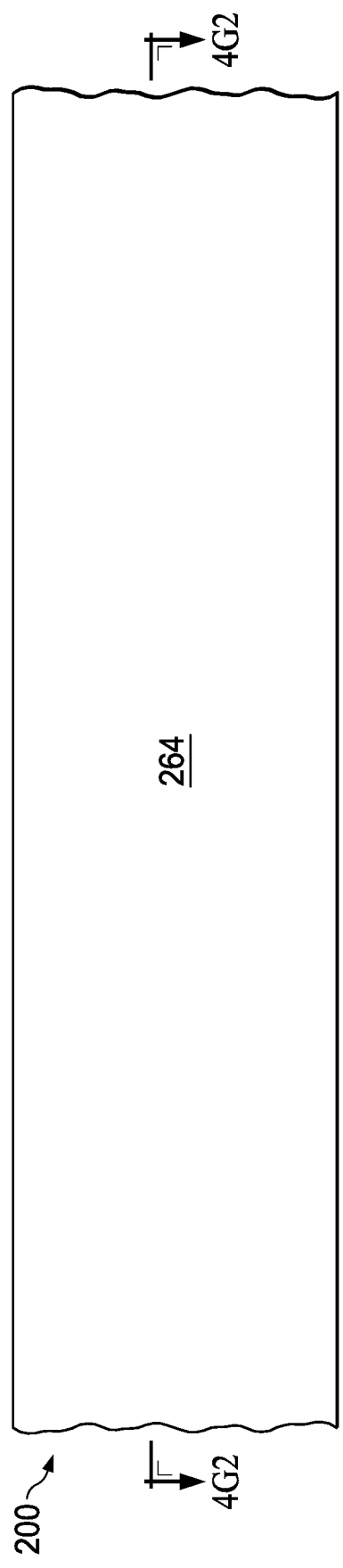
FIG. 4G1
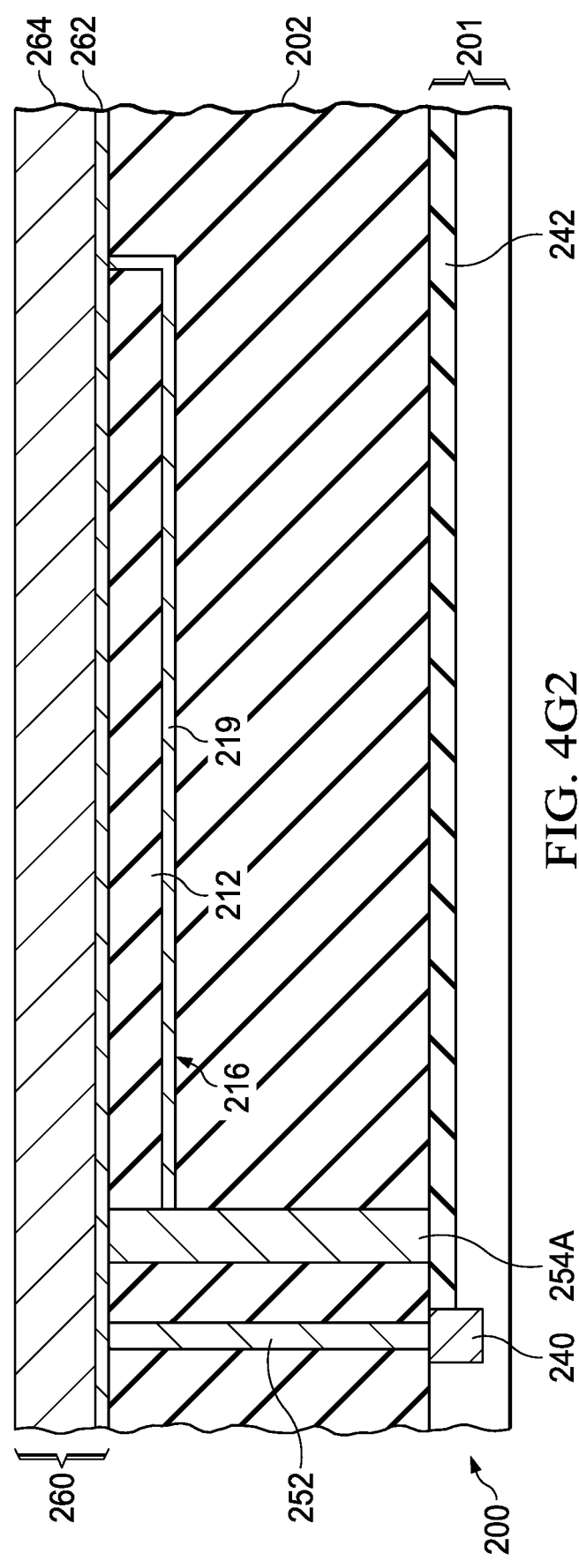
FIG. 4G2

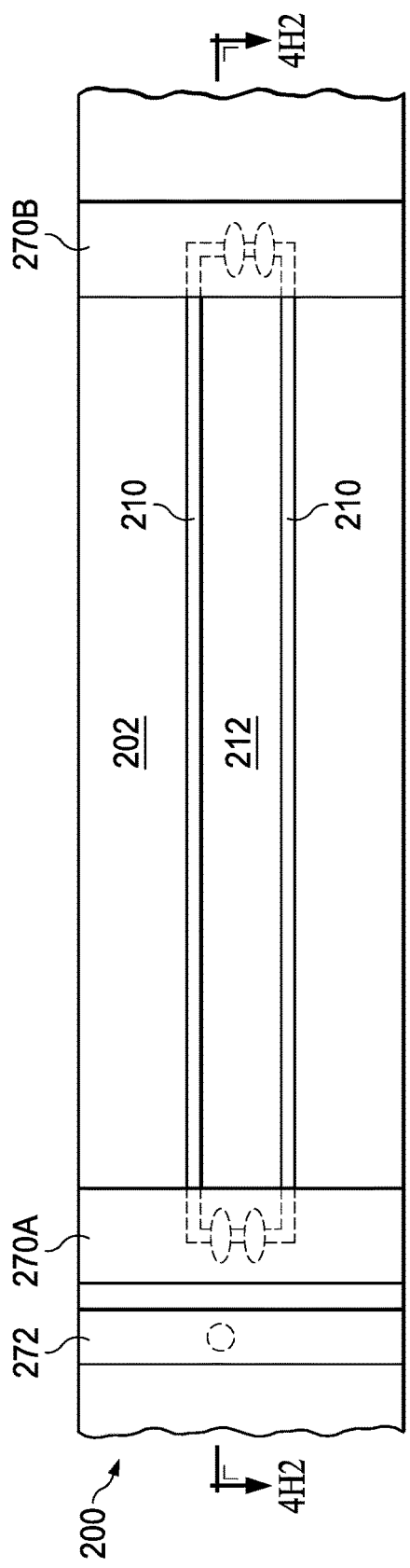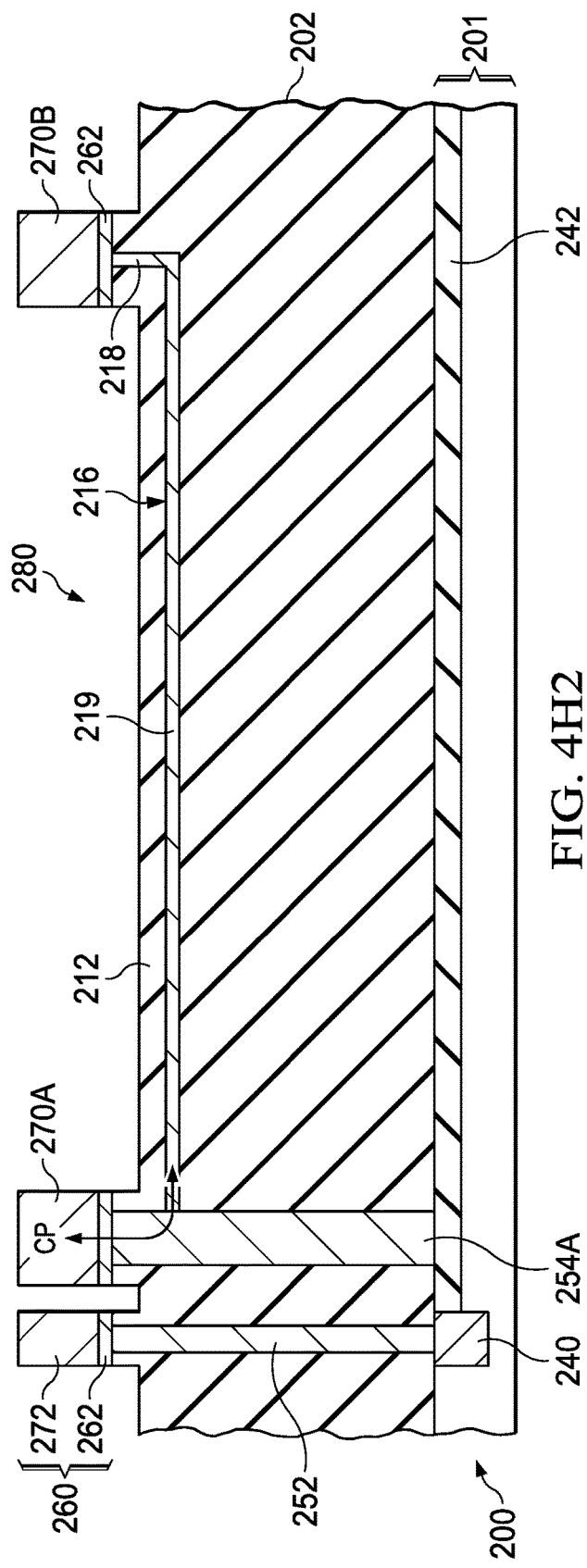
FIG. 4H1
FIG. 4H2

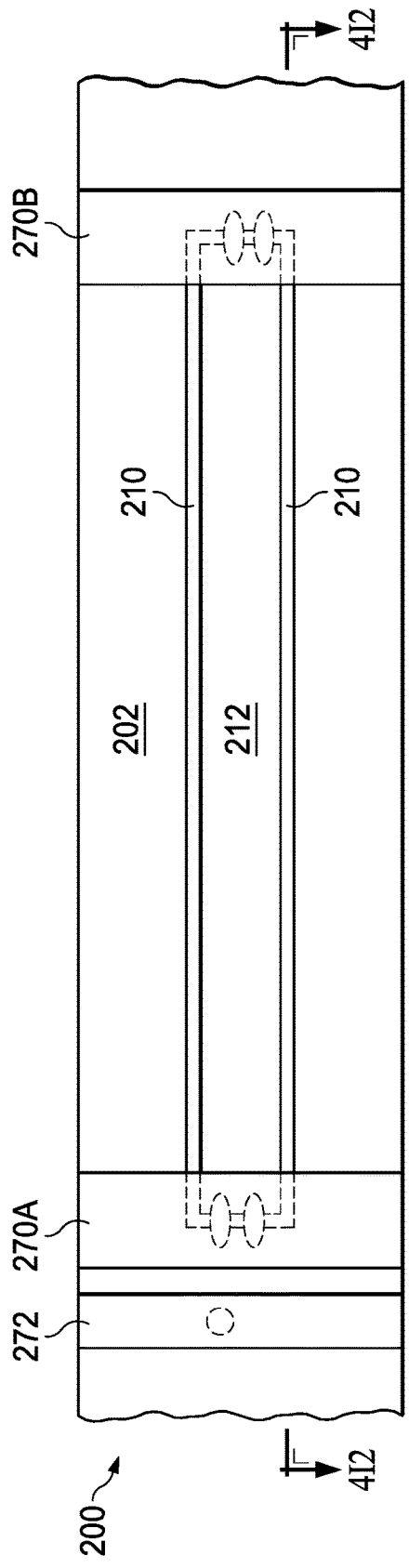
FIG. 4I1
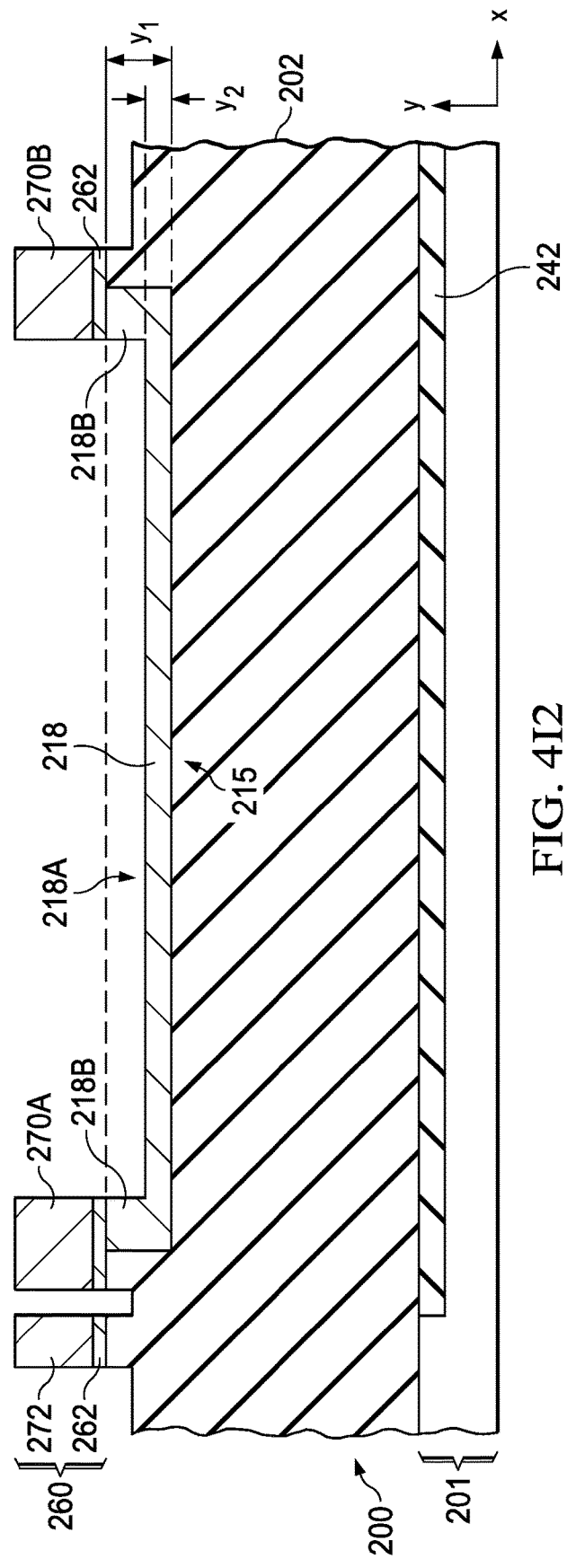
FIG. 4I2

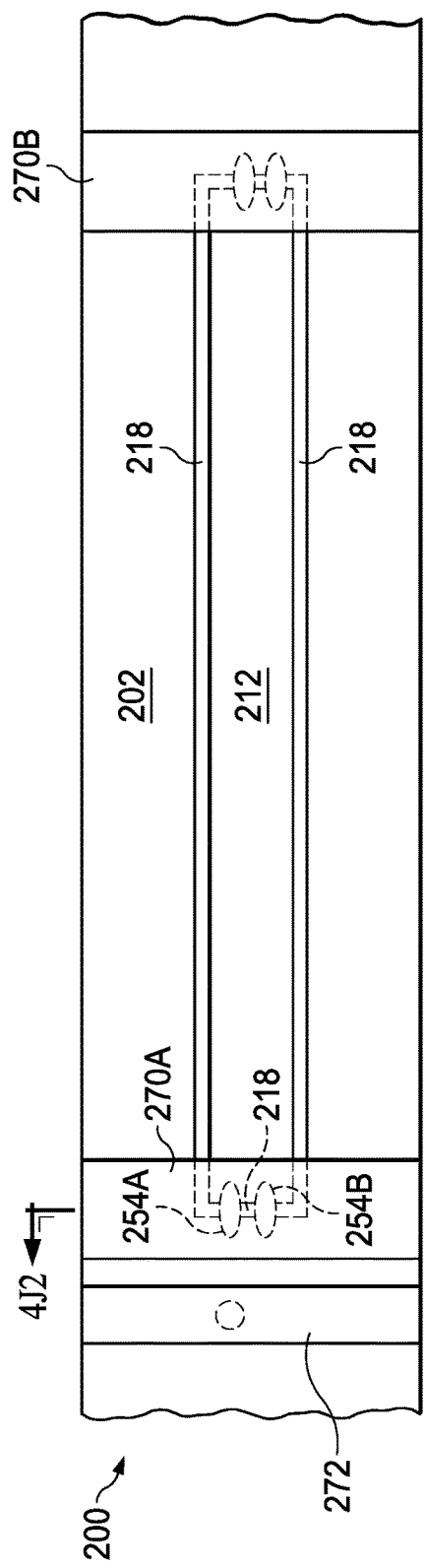
FIG. 4J1
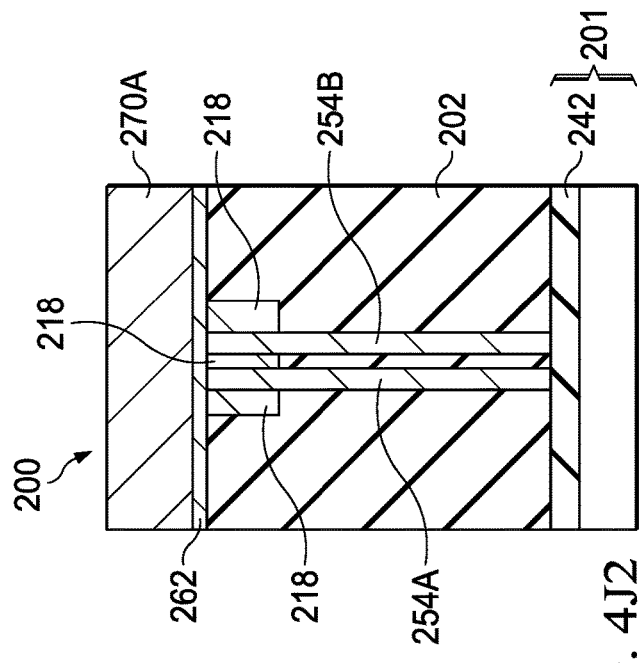
FIG. 4J2

ALUMINUM COMPATIBLE THIN-FILM RESISTOR (TFR) AND MANUFACTURING METHODS

RELATED PATENT APPLICATION

This application claims priority to commonly owned U.S. Provisional Patent Application No. 62/685,676 filed Jun. 15, 2018, the entire contents of which are hereby incorporated by reference for all purposes.

TECHNICAL FIELD

The present disclosure relates to thin-film resistors (TFRs), in particular to TFR modules compatible with aluminum interconnects (e.g., aluminum TFR heads) and/or having increased area of metal-to-TFR connection, and methods for manufacturing such TFR modules.

BACKGROUND

Semiconductor integrated circuits (IC) typically include metallization layers to connect various components of the IC, called interconnect, or back end of line (BEOL) elements. These metal layers are typically formed from copper or aluminum.

One known technique for forming copper interconnects on an IC is known as additive patterning, sometimes called a damascene process, which refers to traditional metal inlaying techniques. A so-called damascene process may include patterning dielectric materials, such as silicon dioxide, or fluorosilicate glass (FSG), or organo-silicate glass (OSG) with open trenches where the copper or other metal conductors should be. A copper diffusion barrier layer (typically Ta, TaN, or a bi-layer of both) is deposited, followed by a deposited copper seed layer, followed by a bulk Copper fill, e.g., using an electro-chemical plating process. A chemical-mechanical planarization (CMP) process may then be used to remove any excessive copper and barrier, and may thus be referred to as a copper CMP process. The copper remaining in the trench functions as a conductor. A dielectric barrier layer, e.g., SiN or SiC, is then typically deposited over the wafer to prevent copper corrosion and improve device reliability.

With more features being packed into individual semiconductor chips, there is an increased need to pack passive components, such as resistors, into the circuits. Some resistors can be created through ion implantation and diffusion, such as poly resistors. However, such resistors typically have high variations in resistance value, and may also have resistance values that change drastically as a function of temperature. A new way to construct integrated resistors, called Thin-Film Resistors (TFRs) has been introduced in the industry to improve integrated resistor performance. Known TFRs are typically formed from SiCr (silicon-chromium), SiCCr (silicon-silicon carbide-chromium), TaN (tantalum nitride), NiCr (nickel-chromium), AlNiCr (aluminum-doped nickel-chromium), or TiNiCr (titanium-nickel-chromium), for example Most typical TFR construction methods utilize two or more additional photomasks, which adds cost to the manufacturing process. In addition, some TFRs are not compatible with interconnects formed from particular metals. For example, some TFRs or TFR manufacturing methods are not compatible with copper interconnects, while other TFRs or TFR manufacturing methods are not compatible with aluminum interconnects.

FIG. 1 shows a cross-sectional view of two example TFRs 10A and 10B devices implemented using conventional processes, which typically require three added mask layers. A first added mask layer is used to create the TFR heads 12A and 12B. A second added mask layer is used to create the TFRs 14A and 14B. A third added mask layer is used to create TFR vias 16A and 16B. As shown, TFRs 12A and 12B are formed across the top and bottom of TFR heads 12A and 12B, respectively, but in each case three added mask layers are typically required.

FIG. 2 shows a cross-sectional view of a known IC structure including an example TFR 30 formed in view of the teachings of U.S. Pat. No. 9,679,844, wherein TFR 30 can be created using a single added mask layer and damascene process, for copper back-end-of-line (BEOL) connection. A TFR film 34, in this example a SiCCr film, may be deposited into trenches patterned into a previously processed semiconductor substrate. As shown, SiCCr film 34 is constructed as a resistor between conductive (e.g., copper) TFR heads 32, with an overlying dielectric region including a dielectric layer 36 (e.g., SiN or SiC) and a dielectric cap region 38 (e.g., SiO2) formed over the SiCCr film 34. The IC structure including TFR 30 may be further processed for a typical Cu (copper) interconnect process (BEOL), e.g., next level of via and trench. TFR 30 may be connected with other parts of the circuit using typical copper vias 40 connected to the copper TFR heads 32 for example.

BRIEF DESCRIPTION OF THE DRAWINGS

Example aspects of the present disclosure are described below in conjunction with the figures, in which:

FIGS. 3A1-3A2 through 3I1-3I2 illustrate an example process for forming an example IC structure with an integrated TFR, according to one example embodiment; and FIGS. 4A1-4A2 through 4J1-4J2 illustrate an example process for forming another example IC structure with an integrated TFR, according to another example embodiment.

SUMMARY

Embodiments of the present disclosure provide thin-film resistor (TFR) modules with aluminum TFR heads, i.e., aluminum back-end-of-line (BEOL) contact. Some embodiments provide methods for forming such TFR modules using one a single added mask layer.

In some embodiments, TFR element "ridges" that may negatively affect the TCR (temperature coefficient of resistance) or other performance characteristic of the TFR module may be partially or fully reduced or eliminated during a metal etch that forms the TFR heads (e.g., aluminum heads).

Some embodiments also provide conductive TFR contacts that increase the surface contact area between the TFR heads (e.g., aluminum heads) and the TFR element, to thereby increase the conductive path between the TFR heads via the TFR element, and thereby improve the performance of the TFR module, e.g., for high current applications.

DETAILED DESCRIPTION

Embodiments of the present disclosure provide thin-film resistor (TFR) modules providing various advantages with respect to existing TFR modules, as discussed herein.

FIGS. 3A1-3A2 through 3I1-3I2 illustrate an example process for forming an example IC structure with an integrated TFR with aluminum heads, according to one example embodiment. Each pair of FIGS. 3n1/3n2 (e.g., figure pair 3A1/3A2, figure pair 3B1/3B2, etc.) shows a top view and a cross-sectional side view, respectively, at a selected point in the example process. The process may begin by forming a single-damascene TFR structure as shown in FIGS. 3A-3C discussed below, e.g., using any of the techniques disclosed in U.S. Pat. No. 9,679,844, the entire contents of which are hereby incorporated by reference, followed by the formation of aluminum TFR heads over the TFR structure, as discussed below.

Figure 1:
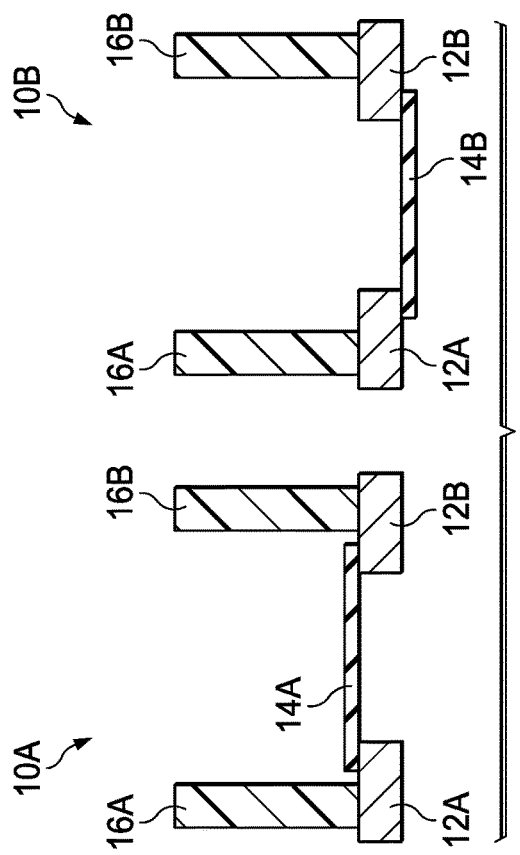
FIG. 1 is a cross-sectional view of two example thin-film resistor (TFR) devices implemented using known processes.
Figure 2:
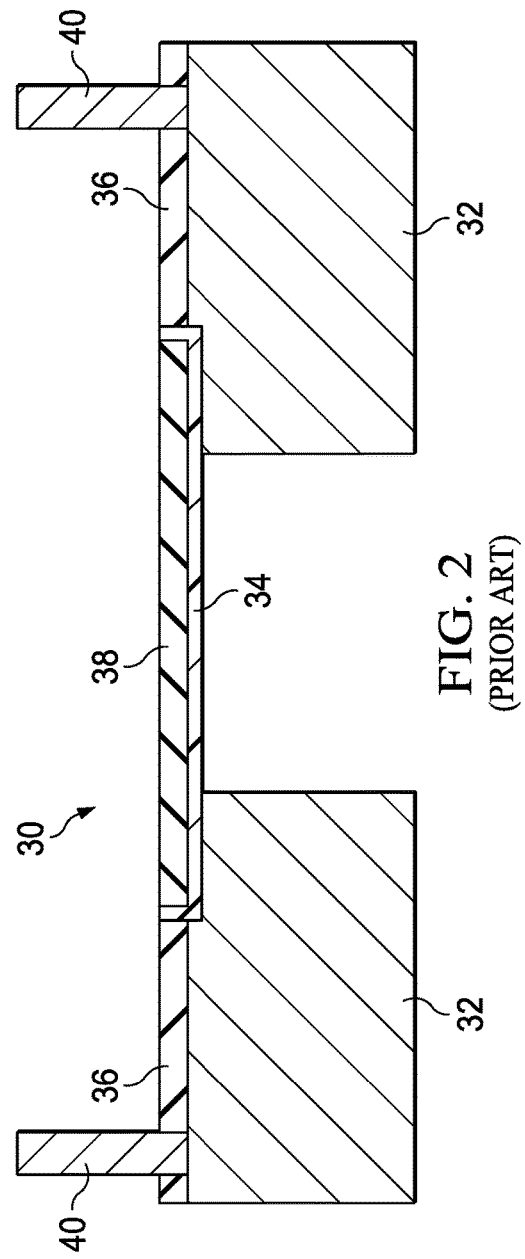
FIG. 2 is a cross-sectional view of a known integrated circuit (IC) structure including an example TFR formed according to known techniques.

FIGS. 3A1 and 3A2 show the initial formation of an IC structure 100, by forming a dielectric layer 102 over an underlying structure 101, e.g., including a substrate, field oxide, metal layer(s), IC devices, etc. In one embodiment, dielectric layer 102 may comprise a pre-metal dielectric (PMD) layer or region. In one embodiment, the TFR may be formed in an IMD (inter-metal dielectric) after metal interconnects (metal lines) have been created. As shown, a TFR trench 104 may be formed by patterning and etching the dielectric layer 102.

As shown in FIGS. 3B1 and 3B2, a layer of TFR material 110, also referred to as a "TFR film," may be deposited over the structure and extending into the TFR trench 104, followed by a dielectric cap layer 112. In some embodiments, an anneal may be performed between the deposition of TFR layer 110 and dielectric cap layer 112, as discussed below.

TFR layer 110 may comprise SiCr, SiCCr, TaN, NiCr, AlNiCr, TiNiCr, or any other suitable TFR material. TFR layer 110 may be deposited in any suitable manner, e.g., using a PVD or sputter deposition process, with any suitable thickness, e.g., about 500 Å (e.g., 400 Å-600 Å). In some embodiments, the TFR layer thickness may be selected based on a target sheet resistance, e.g., 500-1000 Ω/sq.

As mentioned above, in some embodiments, structure 100 including TFR layer 110 may then be annealed, e.g., at a temperature of about 500° C. (e.g., 400° C.-600° C. or 450° C.-550° C.) for about 30 minutes (e.g., 20-60 min) to achieve 0 ppm or near 0 ppm TCR (temperature coefficient of resistance) of the TFR layer 110 or the resulting TFR module 115 (discussed below). In some embodiments, "near 0" ppm TCR may include a TCR of 0±400 ppm/° C., or a TCR of 0±100 ppm/° C., or a TCR of 0±50 ppm/° C., or a TCR of 0±20 ppm/° C., or a TCR of 0±10 ppm/° C., depending on the particular embodiment. In some particular embodiments, TFR layer 110 or TFR module 115 may have a TCR of about 40 ppm/° C., e.g., 40±30 ppm/° C., or 40±20 ppm/° C., or 40±10 ppm/° C., e.g., as disclosed in U.S. provisional patent application No. 62/670,880 filed May 14, 2018 (see, e.g., FIG. 10B and corresponding text), the entire contents of which application are hereby incorporated by reference.

Dielectric cap layer 112 may then be deposited on structure 100, to protect TFR film 110. In one embodiment, dielectric cap layer 112 may comprise a SiN layer with a thickness of about 500 Å (e.g., 400 Å-600 Å) or about 750 Å (e.g., 600 Å-900 Å).

As shown in FIGS. 3C1 and 3C2, structure 100 may be further processed by performing a CMP stopped at or in the dielectric cap layer 112 to remove the upper portions (i.e., outside the TFR trench 104) of TFR layer 110 and dielectric cap layer 112, and thereby define the structure of a TFR module 114 having a formed TFR element 116. In some embodiments, the CMP is performed with a target remaining cap layer thickness (layer 112) of about 1000 Å (e.g., 500 Å-1500 Å).

As a result of the damascene construction, the TFR element 116 may include ridges 118 at one or more edges of the TFR element 116, extending vertically upwardly from a horizontally-extending bottom region 119 of the element 116 (formed in the bottom of the TFR trench). These ridges 118 may provide unwanted effects, e.g., regarding the temperature coefficient of resistance (TCR) of the TFR module 115. Thus, as discussed below with reference to FIGS. 3I1, 3I2, one or more of these ridges 118 may be at least partially removed during a metal etch for forming the aluminum TFR heads, to improve the performance (e.g., improved TCR) of the TFR module. The height of TFR element ridges 118, indicated at "y", may be defined by the depth of the TFR trench 104 and/or the depth of penetration of the CMP performed in this step.

As shown in FIGS. 3D1 and 3D2, a photomask 120 may be formed on the structure 100 and patterned to form at least one mask opening 122 for creating at least one conductive device contact in the underlying structure. Mask opening 122 may be aligned over or adjacent a conductive element 140, e.g., a metal contact or interconnect, in the underlying structure 101, such that the subsequently formed device contact is in contact with the conductive element 140.

As shown in FIGS. 3E1 and 3E2, an etch may be performed through the mask opening 132 to create a contact opening 132 extending through the dielectric layer 102 and landing on or adjacent conductive element 140, and photomask 120 may be removed.

As shown in FIGS. 3F1 and 3F2, the contact opening 132 may be filled with metal, e.g., tungsten, to define a device contact 152 in contact with conductive element 140 in the underlying structure 101.

As shown in FIGS. 3G1 and 3G2, a metal layer or stack 160 may be deposited over the TFR module 114 and device contact 153. Metal layer or stack 160 may define a metal-1 or M-1 layer. In some embodiments, metal layer or stack 160 may comprise aluminum. In the illustrated example, metal stack 160 includes a thin Ti or TiN layer deposited on the structure, followed by a thick aluminum layer 164. In some embodiments a further TiN layer may be deposited over the aluminum layer 164.

As shown in FIGS. 3H1 and 3H2, metal stack 160 may be patterned and etched using a suitable metal etch, to define (a) a pair of aluminum TFR heads 170A and 170B on opposing ends of the TFR module 114 and (b) an aluminum contact 172 coupled to device contact 152. As shown in FIG. 3H2, aluminum TFR heads 170A and 170B may contact the vertically-extending ridges 118 of TFR element 116, to thereby define a conductive path between TFR heads 170A and 170B via TFR element 116.

FIG. 3H2 also shows that the metal etch may remove a partial vertical thickness (or in another embodiment, a full thickness) of the TFR dielectric cap region 112.

FIGS. 3I1 and 3I2 show the structure at the same point in the process as FIGS. 3H1 and 3H2, but the cross-section shown in FIG. 3I2 is taken through one of the TFR element ridges 118, as opposed to the cross-section shown in FIG. 3H2 taken through an interior location of TFR element 116. As shown in FIG. 3I2, the metal etch may also remove a partial or full thickness of the respective TFR element ridge 118 in the "y" direction, indicated at 118A, along a partial or full length of the respective TFR element ridge 118 in the "x" direction. In the illustrated embodiment, the TFR element ridge 118 shown in cross-section I-I (as well as the matching TFR element ridge 118 on the opposite side of the TFR module 114) is reduced by the metal etch from a thickness y1 to a reduced thickness y2, along the x-direction length of the ridge 118 except for the portions 118B covered by aluminum TFR heads 170A and 170B.

As discussed above, the TFR element ridges 118 may negatively affect the temperature coefficient of resistance (TCR) of the TFR module 115. Thus, the reduction of the TFR element ridges 118 may improve the TCR performance of TFR module 115.

FIGS. 4A1-4A2 through 4J1-4J2 illustrate an example process for forming an example IC structure with an integrated TFR with aluminum heads, and including TFR contacts for increasing the contact area between the aluminum TFR heads and the TFR element, according to one example embodiment. Each pair of FIGS. 4*n*1/4*n*2 (e.g., figure pair 4A1/4A2, figure pair 4B1/4B2, etc.) shows a top view and a cross-sectional side view, respectively, at a selected point in the example process. The process may begin similar to the process of FIGS. 3A-3I discussed above. Thus, FIGS. 4A1-4C2 correspond with FIGS. 3A1-3C2, wherein elements 4*xx* shown in FIGS. 4A1-4C2 correspond with elements 3*xx* shown in FIGS. 3A1-3C2.

FIGS. 4A1 and 4A2 show the initial formation of an IC structure 200, by forming a dielectric layer 202 over an underlying structure 201, e.g., including a substrate, field oxide, metal layer(s), IC devices, etc. Underlying structure 201 may include suitable structures for subsequently formed device contact(s) and/or TFR contact(s) to land on, e.g., as discussed below. In one embodiment, dielectric layer 202 may comprise a pre-metal dielectric (PMD) layer or region. In one embodiment, the TFR may be formed in an IMD (inter-metal dielectric) after metal interconnects (metal lines) have been created. As shown, a TFR trench 204 may be formed by patterning and etching the dielectric layer 302.

As shown in FIGS. 4B1 and 4B2, a layer of TFR material, or TFR film, 210 may be deposited over the structure and extending into the TFR trench 204, followed by a dielectric cap layer 212. TFR layer 210 may comprise SiCr, SiCCr, TaN, NiCr, AlNiCr, TiNiCr, or any other suitable TFR material. TFR layer 210 may be deposited in any suitable manner, e.g., using a PVD or sputter deposition process, with any suitable thickness, e.g., about 500 Å (e.g., 400 Å-600 Å). In some embodiments, the TFR layer thickness may be selected based on a target sheet resistance, e.g., 500-1000 Ω/sq. Dielectric cap layer 212 may deposited over TFR film 210 to protect TFR film 210. In one embodiment, dielectric cap layer 212 may comprise a SiN layer with a thickness of about 500 Å (e.g., 400 Å-600 Å) or about 750 Å (e.g., 600 Å-900 Å).

In some embodiments, an anneal may be performed between the deposition of TFR layer 210 and dielectric cap layer 212, e.g., to achieve a desired TCR (temperature coefficient of resistance) characteristic of TFR layer 210, as discussed above regarding FIGS. 3B1, 3B2.

As shown in FIGS. 4C1 and 4C2, structure 200 may be further processed by performing a CMP stopped at or in the dielectric cap layer 212 to remove the upper portions (i.e., outside the TFR trench 204) of TFR layer 210 and dielectric cap layer 212, and thereby define the structure of a TFR module 214 having a formed TFR element 216. In some embodiments, the CMP is performed with a target remaining cap layer thickness (layer 212) of about 1000 Å (e.g., 500 Å-1500 Å).

As a result of the damascene construction, the TFR element 216 may include ridges 218 at one or more edges of the TFR element 216, extending vertically upwardly from a horizontally-extending bottom region 219 of the element 216 (formed in the bottom of the TFR trench). These ridges 218 may provide unwanted effects, e.g., regarding the temperature coefficient of resistance (TCR) of the TFR module 215. Thus, as discussed below with reference to FIGS. 4I1, 4I2, one or more of these ridges 218 may be at least partially removed during a metal etch for forming the aluminum TFR heads, to improve the performance (e.g., improved TCR) of the TFR module. The height of TFR element ridges 218, indicated at "y", may be defined by the depth of the TFR trench 204 and/or the depth of penetration of the CMP performed in this step.

After processing shown in FIGS. 4C1, 4C2, the method may depart from the method of FIGS. 3A-3I discussed above, in particular by the additional formation of TFR contacts to increase the contact area between TFR element 216 and subsequently formed TFR heads.

As shown in FIGS. 4D1 and 4D2, a photomask 220 may be formed on the structure 200 and patterned to form (a) at least one first mask opening 222 for creating at least one conductive device contact 252 (discussed below) in the underlying structure and (b) at least one second mask opening 224 for creating at least one TFR contact 254 (discussed below) for increasing the contact area between TFR element 216 and subsequently formed TFR heads. In this example, four second mask openings 224A-224D are formed for creating four TFR contacts 254A-254D as discussed below.

Each first mask opening 222 may be aligned over or adjacent a respective conductive element 240, e.g., a metal contact or interconnect, in the underlying structure 201, such that the subsequently formed device contact 252 is in contact with the conductive element 240. As shown in FIG. 4D1, each second mask opening 224 (in this example, each opening 224A-224D) may be aligned over a TFR element ridge 218, such that each subsequently formed TFR contact 254A-254D penetrates a respective TFR element ridge 218, as shown in subsequent figures and discussed below. In this example, mask opening 224 are located to form TFR contact 254 extending through the TFR element ridges 218 at opposing longitudinal ends of the TFR element 216. In other embodiments, one or more mask opening 224 may be located to form TFR contact 254 extending through any one, two, three, or all four of the TFR element ridges 218 extending around the perimeter of TFR element 216.

In addition, second mask openings 224 may be aligned over an inert or non-conductive region 242, e.g., an oxide or dummy poly layer or block, in the underlying structure 201, such that the subsequently formed TFR contacts 254 may land on the an inert or non-conductive region 242. In one embodiment, the TFR contact 254 may land on a conductive device required to be connected to the TFR.

In some embodiments, each second mask opening 224 may have a circular shape; an elongated shape, e.g., an oval/ellipse (as shown in FIG. 4E1) or an elongated rectangle; or any other suitable shape. Using an elongated shape of openings 224 may increase the resulting contact area between TFR contacts 254 and TFR element 216 (e.g., at TFR ridge(s) 218 and/or at TFR bottom region 291).

As shown in FIGS. 4E1 and 4E2, an etch may be performed through the mask openings 232 and 234A-234D to create (a) a contact opening 232 extending through dielectric layer 202 and landing on or adjacent conductive element 240, and (b) TFR contact openings 234A-234D extending through dielectric layer 202 and landing on inert or non-conductive region 242. Photomask 220 may then be removed.

As shown in FIGS. 4F1 and 4F2, the contact opening 232 and 234A-234D may be filled with metal, e.g., tungsten, to define (a) a device contact 252 extending through dielectric layer 202 and contacting conductive element 240 in the underlying structure 201 and (b) TFR contacts 254A-254D extending through dielectric layer 202 and landing on inert or non-conductive region 242. In one embodiment, the TFR contact 254 may land on a conductive device required to be connected to the TFR.

As shown in FIGS. 4G1 and 4G2, a metal layer or stack 260 may be deposited over the TFR module 214, TFR contacts 254, and device contact 252. Metal layer or stack 260 may define a metal-1 or M-1 layer. In some embodiments, metal layer or stack 260 may comprise aluminum. In the illustrated example, metal stack 260 includes a thin Ti or TiN layer deposited on the structure, followed by a thick aluminum layer 264. In some embodiments a further TiN layer may be deposited over the aluminum layer 264.

As shown in FIGS. 4H1 and 4H2, metal stack 260 may be patterned and etched using a suitable metal etch, to define (a) a pair of aluminum TFR heads 270A and 270B on opposing ends of the TFR module 214 and (b) an aluminum contact 272 coupled to device contact 252. As shown in FIG. 4H2, a bottom surface of each aluminum TFR head 270A and 270B contacts at least one TFR element ridge 218 and a respective pair of TFR contacts 254, to thereby define a conductive path between TFR heads 270A and 270B via TFR contacts 254A-254D and TFR element 216.

FIG. 4H2 also shows that the metal etch may remove a partial vertical thickness (or in another embodiment, a full thickness) of the TFR dielectric cap region 212.

FIGS. 4I1 and 4I2 show the structure at the same point in the process as FIGS. 4H1 and 4H2, but the cross-section shown in FIG. 4I2 is taken through one of the TFR element ridges 218, as opposed to the cross-section shown in FIG. 4H2 taken through an interior location of TFR element 216. As shown in FIG. 4I2, the metal etch may also remove a partial or full thickness of the respective TFR element ridge 218 in the "y" direction, indicated at 218A along a partial or full length of the respective TFR element ridge 218 in the "x" direction. In the illustrated embodiment, the TFR element ridge 218 shown in cross-section I-I (as well as the matching TFR element ridge 218 on the opposite side of the TFR module 214) is reduced by the metal etch from a thickness y1 to a reduced thickness y2, along the x-direction length of the ridge 218 except for the portions 218B covered by aluminum TFR heads 270A and 270B.

FIGS. 4J1 and 4J2 show the structure at the same point in the process as FIGS. 4H1/4H2 and 4I1/4I2, but wherein the cross-section shown in FIG. 4J2 is taken through line J-J extending through the TFR element ridge 218 at one longitudinal end of TFR element 216. As shown in the cross-sectional view, TFR contacts 254A and 254B penetrate through the TFR element ridge 218 to define areas of surface contact between (a) lateral surfaces of each TFR contact 254A and 254B and TFR element ridge 218, and also between (b) lateral surfaces of each TFR contact 254A and 254B and horizontally-extending bottom region 219 of TFR element 216 (more clearly shown in FIG. 4H2). These areas of contact between TFR contact 254 and TFR element 216 increase the conductive path between each TFR head 270A and 270B and TFR element 216, which may thereby improve the performance of TFR module 214, e.g., particularly in high current applications.

The invention claimed is:

1. A thin film resistor (TFR) module, comprising:
a TFR element including a laterally-extending TFR element portion and a vertical TFR ridge extending upwardly from the laterally-extending TFR element portion, the laterally-extending TFR element portion and vertical TFR ridge defining a continuous, contiguous TFR element formed from the same material;
a conductive TFR contact extending through the vertical TFR ridge, wherein the conductive TFR contact is wider than the vertical TFR ridge in a lateral direction, such that only a partial circumference of an outer surface of the conductive TFR contact is in contact with the vertical TFR ridge;
a pair of TFR heads formed over the TFR element, wherein a first TFR head is formed in contact with the conductive TFR contact, to thereby define a conductive path from the first TFR head to the TFR element via the TFR contact.

2. The TFR module of claim 1, wherein a height of a first portion of the vertical TFR ridge in a direction extending upwardly from the laterally-extending TFR element portion is greater than a height of a second portion of the vertical TFR ridge.

3. The TFR module of claim 2, wherein the conductive TFR contact extends through the first portion of the vertical TFR ridge having the greater height than the second portion of the vertical TFR ridge.

4. The TFR module of claim 2, wherein:
the first portion of the vertical TFR ridge extends upwardly from a first perimeter side of the laterally-extending TFR element portion, and the
the second portion of the vertical TFR ridge extends upwardly from a second perimeter side of the laterally-extending TFR element portion.

5. The TFR module of claim 1, wherein the pair of TFR heads comprise aluminum.

6. The TFR module of claim 1, wherein the conductive TFR contact is located beneath the first TFR head.

7. The TFR module of claim 1, wherein the conductive TFR contact extends below the TFR element.

8. The TFR module of claim 1, wherein the vertical TFR ridge extends upwardly from multiple perimeter edges of the laterally-extending TFR element portion.

9. The TFR module of claim 1, wherein the conductive TFR contact includes:
at least one side surface in contact with the upwardly extending vertical TFR ridge; and
a top surface in contact with the first TFR head;
wherein the conductive TFR contact increases a conductivity between the TFR element and the first TFR head.

10. The TFR module of claim 1, wherein the conductive TFR contact comprises tungsten.

11. The TFR module of claim 1, wherein the TFR element comprises SiCr or SiCCr.

12. The TFR module of claim 1, comprising multiple conductive TFR contacts in direct contact with the first TFR head and spaced apart from each other.

13. The TFR module of claim 1, wherein a pair of outer surface areas of the conductive TFR contact spaced apart from each other in a direction around the circumference of the conductive TFR contact outer surface are in contact with the vertical TFR ridge, and areas between the pair of outer surface areas of the conductive TFR contact in the direction around the circumference of the conductive TFR contact outer surface are not in contact with the vertical TFR ridge.

14. A thin film resistor (TFR) module, comprising:
a TFR element including:
   a laterally-extending TFR element portion having an outer perimeter; and
   a vertical TFR ridge extending upwardly from the outer perimeter of the laterally-extending TFR element portion, the laterally-extending TFR element portion and vertical TFR ridge defining a continuous, contiguous TFR element formed from the same material;
a conductive TFR contact extending vertically through the vertical TFR ridge;
a pair of TFR heads formed over the TFR element, wherein a first TFR head is formed in contact with the conductive TFR contact, to thereby define a conductive path from the first TFR head to the TFR element via the TFR contact;
wherein the vertical TFR ridge has a pair of end portions, each located below a respective one of the TFR heads;
wherein a first portion of the vertical TFR ridge located laterally between the pair of end portions of the vertical TFR ridge has a smaller height in an upwardly extending direction than a height of each end portion of the vertical TFR ridge.

15. A thin film resistor (TFR) module, comprising:
a TFR element including a laterally-extending TFR element portion and a vertical TFR ridge extending upwardly from the laterally-extending TFR element portion, the laterally-extending TFR element portion and vertical TFR ridge defining a continuous, contiguous TFR element formed from the same material and having a maximum TFR vertical height extending from a bottom surface of the laterally-extending TFR element portion to a top surface of the vertical TFR ridge;
a conductive TFR contact extending through the vertical TFR ridge and below the bottom surface of the laterally-extending TFR element portion, and having a TFR contact bottom surface contacting an underlying structure located below and vertically spaced apart from the laterally-extending TFR element portion, such that a vertical height of the conductive TFR contact is greater than the maximum TFR vertical height;
a pair of TFR heads formed over the TFR element, wherein a first TFR head is formed in contact with the conductive TFR contact, to thereby define a conductive path from the first TFR head to the TFR element via the TFR contact.

16. The TFR module of claim 15, wherein the TFR contact bottom surface of the conductive TFR contact contacts an inert or non-conductive underlying structure located below and vertically spaced apart from the laterally-extending TFR element portion.

17. The TFR module of claim 15, wherein the TFR contact bottom surface of the conductive TFR contact contacts a conductive underlying structure located below and vertically spaced apart from the laterally-extending TFR element portion, such that the conductive underlying structure is conductively connected to the TFR element via the conductive TFR contact.

18. The TFR module of claim 15, wherein the conductive TFR contact is wider than the vertical TFR ridge in a lateral direction, such that only a partial circumference of an outer surface of the conductive TFR contact is in contact with the vertical TFR ridge.

19. The TFR module of claim 15, wherein a vertical height of a first portion of the vertical TFR ridge extending upwardly from a first perimeter side of the laterally-extending TFR element portion is greater than a vertical height of a second portion of the vertical TFR ridge upwardly from a second perimeter side of the laterally-extending TFR element portion.

20. The TFR module of claim 15, wherein the conductive TFR contact includes:
   at least one side surface in contact with the upwardly extending vertical TFR ridge; and
   a top surface in contact with the first TFR head;
   wherein the conductive TFR contact increases a conductivity between the TFR element and the first TFR head.

* * * * *